(12) United States Patent
Nansei et al.

(10) Patent No.: US 7,098,147 B2
(45) Date of Patent: Aug. 29, 2006

(54) SEMICONDUCTOR MEMORY DEVICE AND METHOD FOR MANUFACTURING SEMICONDUCTOR DEVICE

(75) Inventors: Hiroyuki Nansei, Aizuwakamatsu (JP); Manabu Nakamura, Aizuwakamatsu (JP); Kentaro Sera, Aizuwakamatsu (JP); Masahiko Higashi, Aizuwakamatsu (JP); Yukihiro Utsuno, Aizawakamatsu (JP); Hideo Takagi, Aizuwakamatsu (JP); Tatsuya Kajita, Aizuwakamatsu (JP)

(73) Assignee: Fujitsu Amd Semiconductor Limited, Aizuwakamatsu (JP)

( * ) Notice: Subject to any disclaimer, the term of this patent is extended or adjusted under 35 U.S.C. 154(b) by 0 days.

(21) Appl. No.: 10/643,967

(22) Filed: Aug. 20, 2003

(65) Prior Publication Data

US 2004/0043638 A1  Mar. 4, 2004

(30) Foreign Application Priority Data

Aug. 30, 2002  (JP) ............................ 2002-256195

(51) Int. Cl.
*H01L 21/31* (2006.01)
(52) U.S. Cl. .................. 438/769; 438/261; 438/287; 438/288; 438/591; 438/771; 438/772; 438/776; 438/777; 438/954
(58) Field of Classification Search .................. None
See application file for complete search history.

(56) References Cited

U.S. PATENT DOCUMENTS

| | | | | |
|---|---|---|---|---|
| 5,330,935 A | * | 7/1994 | Dobuzinsky et al. | 438/767 |
| 5,668,035 A | * | 9/1997 | Fang et al. | 438/239 |
| 5,685,949 A | * | 11/1997 | Yashima | 438/694 |
| 5,861,347 A | * | 1/1999 | Maiti et al. | 438/787 |
| 6,087,229 A | | 7/2000 | Aronowitz et al. | |
| 6,133,096 A | * | 10/2000 | Su et al. | 438/264 |
| 6,383,861 B1 | * | 5/2002 | Gonzalez et al. | 438/241 |
| 6,399,520 B1 | * | 6/2002 | Kawakami et al. | 438/778 |
| 6,436,771 B1 | * | 8/2002 | Jang et al. | 438/275 |
| 6,479,402 B1 | * | 11/2002 | Yang et al. | 438/763 |
| 6,531,364 B1 | * | 3/2003 | Gardner et al. | 438/287 |
| 2002/0025691 A1 | * | 2/2002 | Ohmi et al. | 438/787 |
| 2003/0040171 A1 | * | 2/2003 | Weimer | 438/585 |
| 2003/0211692 A1 | * | 11/2003 | Lee | 438/258 |
| 2004/0038486 A1 | * | 2/2004 | Chua et al. | 438/287 |

(Continued)

FOREIGN PATENT DOCUMENTS

JP  4-184932  7/1992

OTHER PUBLICATIONS

Wolf, Ph.D., Stanley, Semiconductor Memory Process Integration, Silicon Processing for the VLSI Era—vol. 2: Process Integration, Lattice Press, 1986, pp. 628-629.*

*Primary Examiner*—Zandra V. Smith
*Assistant Examiner*—Toniae M. Thomas
(74) *Attorney, Agent, or Firm*—Westerman, Hattori, Daniels & Adrian, LLP.

(57) ABSTRACT

After a lower silicon oxide film is formed on a silicon region, a silicon film is formed on the lower silicon oxide film by, for example, a thermal CVD method. Subsequently, the silicon film is completely nitrided by a plasma nitriding method to be replaced by a silicon nitride film. Subsequently, a surface layer of the silicon nitride film is oxidized by a plasma oxidizing method to be replaced by an upper silicon oxide film. An ONO film as a multilayered insulating film composed of the lower silicon oxide film, the silicon nitride film, and the upper silicon oxide film is formed.

12 Claims, 36 Drawing Sheets

U.S. PATENT DOCUMENTS

2004/0245584 A1* 12/2004 Murakawa et al. ......... 257/411
2005/0032393 A1* 2/2005 Weimer ..................... 438/769
2005/0040479 A1* 2/2005 Koldiaev et al. ........... 257/411
2005/0224866 A1* 10/2005 Higashi et al. ............. 257/324

* cited by examiner

SEMICONDUCTOR MEMORY DEVICE AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2002-256195, filed on Aug. 30, 2002, the entire contents of which are incorporated herein by reference.

BACKGROUND OF THE INVENTION

1. Field of the Invention

The present invention relates to a method for manufacturing a semiconductor device having a gate insulation film or a dielectric film including a nitrided film, and a semiconductor memory device capable of holding information by storing electric charges in the nitrided film.

2. Description of the Related Art

Recently, an ON film composed of a silicon nitride film formed on a silicon oxide film, and an ONO film composed of a silicon oxide film, a silicon nitride film, and a silicon oxide film formed in this order are used for a memory cell of a semiconductor memory device.

A multilayered insulating film such as the ON film, the ONO film, or the like (hereinafter often referred to as simply a multilayered insulating film) is used as a capacity insulation film with high permittivity and low leakage current in a floating gate type nonvolatile semiconductor memory (hereinafter simply referred to as a floating gate type memory) having an island-shaped floating gate, that is a charge-storage portion, with respect to each memory cell. The multilayered insulating film is used as a gate insulation film of the charge-storage portion in a SONOS type or an MNOS type nonvolatile semiconductor memory (hereinafter simply referred to as a SONOS type (an MNOS type) memory) having the silicon nitride film as the charge-storage portion thereof.

Recently, a tendency toward a demand for miniaturization and high performance of a semiconductor memory has been further increasing, and accordingly, the following serious problems regarding formation of the multilayered insulating film have been raised.

-Influence of Generation of Hydrogen-

A lower silicon oxide film which is on a bottom layer of the ONO film and the ON film in the SONOS type memory, the MNOS type memory, or the like functions as a tunnel oxide film, and extremely high reliability is required. Therefore, generally, it is formed by thermal oxidation of a silicon surface under a temperature condition of 1000° C. or above in dry oxidation, and under a temperature condition of 800° C. or above in wet oxidation.

Subsequently, the silicon nitride film to be the charge-storage portion is formed on the lower silicon oxide film. It is deposited by a thermal CVD method using ammonia and silane as raw material gases. In addition to that high uniformity is required, a temperature condition is set as high as from 700° C. to 900° C. based on the following reasons.

Here, concerning the SONOS type memory, FIG. 36 shows a result of a study in a relationship between a deposition temperature of the silicon nitride film and a threshold value (Vt) shift caused by leaving the silicon nitride film under a high temperature condition. This characteristic chart tells that the higher the deposition temperature of the silicon nitride film is, the lower the amount of Vt shift is, so as to generate a better result. It is inferred that this may be caused by the following reasons.

When the silicon nitride film is formed, a large amount of hydrogen is generated from a raw material gas, and passes into the lower silicon oxide film at the same time with deposition of the silicon nitride film. Simultaneously, the large amount of hydrogen is entrapped also in the silicon nitride film. Here, when the ONO film is formed as the multilayered insulating film, an upper silicon oxide film is formed by further thermal oxidation of a surface of the silicon nitride film. However, since heat treatment with a high temperature and long hours is required, the hydrogen entrapped in the silicon nitride film is diffused and passes into the lower silicon oxide film. It is clear that the passing of the hydrogen into the lower silicon oxide film causes deterioration of a film quality of the lower silicon oxide film.

When the deposition temperature of the silicon nitride film is high, the amount of the hydrogen entrapped in the silicon nitride film decreases. Furthermore, the amount of passing of the hydrogen into the lower silicon oxide film by diffusion is lowered in a later process, which is thought to lower the amount of the Vt shift. Accordingly, the silicon nitride film is required to be formed as high temperature as possible in order to improve the film quality of the lower silicon oxide film by controlling generation of the hydrogen and to obtain the good Vt shift.

The same thing can be said to the floating gate type memory. Since high temperature is required for forming the multilayered insulating film, the hydrogen reaches the lower silicon oxide film through the floating gate, resulting in deterioration of quality of the lower silicon oxide film as the tunnel oxide film.

-Influence of Processing at High Temperature-

As described above, a temperature condition at a high temperature is required when the multilayered insulating film which includes the silicon nitride film functioning as a charge-storage film or a dielectric film is formed, which prevents miniaturization of an element as described below.

In the memory having the multilayered insulating film, when an element isolation structure is formed by, for example, a LOCOS method or an STI (Shallow Trench Isolation) method, the multilayered insulating film is formed after a well is formed by introducing impurities on a substrate. However, the impurities of the well are thermally diffused by the aforementioned processing at high temperature, resulting in difficulty in miniaturization of the element.

Especially, in a memory having sources/drains also serving as embedded bit lines, when the sources/drains are formed after the multilayered insulating film is formed in order to prevent thermal diffusion of the impurities caused by the processing at high temperature, a defect occurs in the multilayered insulating film by ion implantations of the impurities, causing such a problem as increase in leakage current or decrease in reliability.

As described above, even if the multilayered insulating film such as the ON film, the ONO film, or the like is formed by the thermal CVD method or a thermal oxidation method in order to attempt further miniaturization and high performance of the semiconductor memory, the processing at high temperature is required, thereby preventing miniaturization of the element. This makes a current situation that a semiconductor memory of high performance is difficult to be realized.

SUMMARY OF THE INVENTION

The present invention is invented in consideration of the above-mentioned problems. It is an object of the present invention to provide a method for manufacturing a semiconductor device and a semiconductor memory device of high reliability by forming a multilayered insulating film such as an ON film, an ONO film, or the like in low temperature and of high quality.

Inventors of the present invention made up following aspects of the invention after extremely careful consideration.

A method for manufacturing a semiconductor device according to the present invention comprises: a step of forming a lower silicon oxide film; a step of forming a silicon film on the lower silicon oxide film; and a step of forming a silicon nitride film on the lower silicon oxide film to completely nitride the silicon film by a plasma nitriding method, wherein a multilayered insulating film including at least the lower silicon oxide film and the silicon nitride film is formed.

A method for manufacturing a semiconductor device according to the present invention comprises: a step of forming a silicon nitride film to nitride a surface of a silicon region by a plasma nitriding method; a step of oxidizing a surface of a silicon nitride film and an interface of the surface of the silicon region facing with the silicon nitride film simultaneously by a plasma oxidizing method, and of simultaneously forming an upper silicon oxide film on the surface thereof and a lower silicon oxide film on the interface thereof, wherein a multilayered insulating film composed of the lower silicon oxide film, the silicon nitride film and the upper silicon oxide film is formed.

A method for manufacturing a semiconductor device according to the present invention comprises: a step of forming a lower silicon oxide film; a step of forming a silicon nitride film on the lower silicon oxide film by a CVD method; and a step of oxidizing a surface of the silicon nitride film by a plasma oxidizing method, wherein a multilayered insulating film composed of the lower silicon oxide film, the silicon nitride film and an upper silicon oxide film is formed.

A semiconductor memory device according to the present invention comprises: a memory cell; including a semiconductor substrate, an insulation film including a silicon nitride film having a charge-capture function, formed on the semiconductor substrate, a gate electrode formed on the semiconductor substrate via the insulation film, and a pair of impurity diffused layers formed on the semiconductor substrate, wherein the silicon nitride film is a uniform and dense nitrided film formed by only plasma nitriding through microwave excitation or a series of processing including the plasma nitriding.

A semiconductor memory device according to the present invention comprises: a semiconductor substrate; a gate insulation film formed on the semiconductor substrate; an island-shaped floating gate having a charge-capture function, formed on the semiconductor substrate via the insulation film; a dielectric film formed on the floating gate; a control gate formed on the floating gate via the dielectric film; and a pair of impurity diffused layers formed on the semiconductor substrate, wherein the dielectric film includes a uniform and dense silicon nitride film formed by only plasma nitriding through microwave excitation or a series of processing including the plasma nitriding.

DETAILED DESCRIPTION OF THE PREFERRED EMBODIMENTS

-Basic Structure of the Present Invention-

Figure 1A:
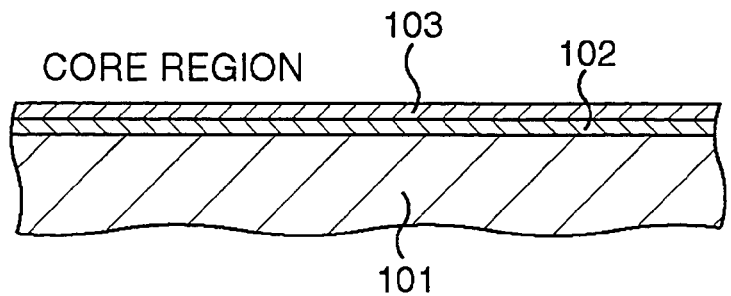
FIG. 1A to FIG. 1C are diagrammatic cross sectional views for explaining a first aspect of the present invention.

First, a basic structure of the present invention is explained.

According to the present invention, about processing in which heating is required for over approximately a few minutes in a low temperature condition through overall manufacturing processing, and specifically, except processing in which rapid temperature increase and rapid temperature decrease are conducted within one minute such as RTA or the like, a semiconductor memory device is manufactured under a low temperature condition of 600° C. or below. Considering the above-mentioned processing, when a silicon nitride film is formed, instead of a CVD method requiring for high temperature, nitriding processing (a plasma nitriding method), for which a nitride radical formed by excited plasma is used, is adopted. Furthermore, not only the silicon nitride film but also a silicon oxide film of a multilayered insulating film is similarly formed by a plasma oxidizing method.

The plasma nitriding method is a method for conducting nitriding processing in which plasma is excited by microwave in an atmosphere containing a source gas containing a nitride atom in addition to one kind or plural kinds of inert gases among He, Ne, Ar, Kr, Xe, and Rn, for example, one kind selected from $NH_3$ gas, a mixed gas of $N_2$ and $H_2$, and $N_2$ gas in addition to the inert gas, or a mixed gas of the $NH_3$ gas and the $N_2$ gas, or the $NH_3$ gas, the mixed gas of $N_2$ and $H_2$ so as to generate a nitride radical (N* radical or NH* radical). According to the method, a plasma nitride film of dense and high quality can be obtained in as low temperature as between approximately 200° C. and 600° C. It should be noted that Ar and Kr are suitable for the inert gas in which the source gas is contained; the plasma nitride film of best quality can be obtained when Kr is used. Furthermore, an oxidizing rate is high when a gas containing hydrogen is used.

The plasma oxidizing method is a method for conducting oxidizing processing in which plasma is excited by microwave in an atmosphere containing a source gas containing an oxygen atom in addition to one kind or plural kinds of inert gases among He, Ne, Ar, Kr, Xe, and Rn, for example, one kind selected from $O_2$, a mixed gas of $O_2$ and $H_2$, and $H_2O$ gas in addition to the inert gas, or a mixed gas of $O_2$ and the $H_2O$ gas, or a mixed gas of $O_2$, $H_2$, and the $H_2O$ gas so as to generate an oxide radical (O* radical or OH* radical). According to the method, a plasma oxide film of dense and high quality can be obtained in as low temperature as between approximately 200° C. and 600° C. It should be noted that Ar and Kr are suitable for the inert gas in which the source gas is contained; the plasma oxide film of best quality can be obtained when Kr is used. Furthermore, an oxidizing rate is high when a gas containing hydrogen is used.

However, the following problems arise when the plasma nitriding method and the plasma oxidizing method are adopted.

Generally, when manufacturing a semiconductor memory, after a multilayered insulating film such as an ON film, an ONO film, or the like is formed on an entire surface including a memory cell region, the multilayered insulating film in a peripheral circuit region is removed and a gate insulation film is formed in the peripheral circuit region by thermal oxidization. In this case, the memory cell region is covered with the multilayered insulating film. An oxidizing rate of the silicon nitride film is extremely as slow as 1/30 or below compared with that of a surface of a substrate. Furthermore, the silicon nitride film does not put through $O_2$, and therefore, an upper silicon oxide film of the multilayered insulating film is only slightly increased. The same thing can be said when an oxynitride film is formed as the gate insulation film. The multilayered insulating film in a memory cell is not affected very much because the silicon nitride film does not put through $N_2O$ or NO.

However, when the gate insulation film in the peripheral circuit region is formed, and when the aforementioned plasma oxidizing method or plasma nitriding method is used, because of extremely strong oxidizing power of the O* radical or the OH* radical, or extremely strong nitriding power of the N* radical or the NH* radical, the silicon nitride film of the multilayered insulating film in the memory cell is oxidized when the silicon oxide film is formed as the gate insulation film, and the silicon oxide film of the multilayered insulating film is further nitrided when a silicon oxynitride film is formed as the gate insulation film. For example, a growth rate of the silicon oxide film made by oxidization of the silicon nitride film of the multilayered insulating film is a same as approximately 0.8 times as the growth rate of the silicon oxide film formed by oxidization of a silicon substrate. Therefore, the silicon nitride film is replaced by the silicon oxide film (or the silicon oxide film by the silicon nitride film).

Inventors of the present invention made up following aspects in consideration to that a peripheral circuit, and especially the gate insulation film therein could be successfully formed by the plasma nitriding method without generating hydrogen and without causing a problem in relation to the multilayered insulating film when the multilayered insulating film of dense and high quality is formed in low temperature, using the plasma nitriding method or the plasma oxidizing method.

-First Aspect-

Figure 1B:
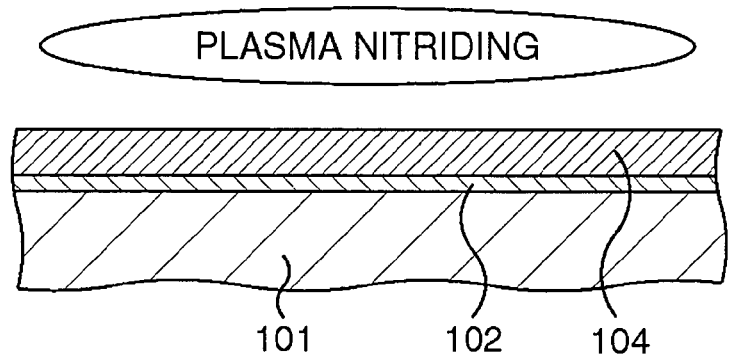
Figure 1C:
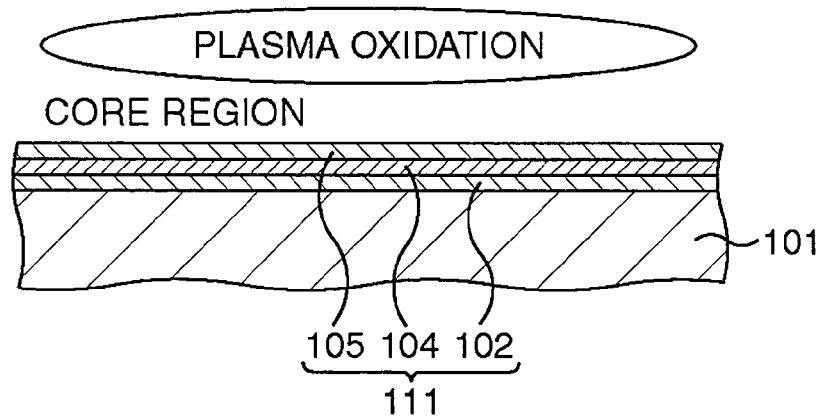
Figure 1C:
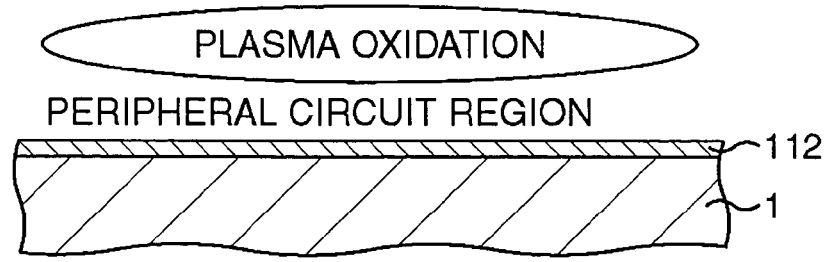

First, a first aspect will be explained. FIG. 1A to FIG. 1C are diagrammatic views for explaining the first aspect. Here, an explanation is given with an example that an ONO film is formed in a memory cell region, and that a gate insulation film is formed in a peripheral circuit region.

In this embodiment, firstly, as shown in FIG. 1A, after a lower silicon oxide film 102 is formed on a silicon region 101 which is a memory cell region of a silicon semiconductor substrate, or is a polycrystalline silicon film or an amorphous silicon (a-Si) film (for example, an island-shaped floating gate) formed in the memory cell region, a silicon film 103 is formed on the lower silicon oxide film 102 by, for example, a thermal CVD method. The polycrystalline silicon film or the a-Si film may be acceptable as the silicon film 103. The a-Si film can grow under a temperature of 575° C. or below, for example, as low as 530° C. Silane containing a hydrogen atom is generally used as a raw material gas. However, little hydrogen is generated because the silane does not contain ammonia. However, the silicon film 103 is required to be formed having a film thickness of 5 nm or more in order to prevent from generating "a gap" caused by deposition unevenness.

Subsequently, as shown in FIG. 1B, the silicon film 103 is completely nitrided by the aforementioned plasma nitriding method to be replaced by a silicon nitride film 104. A preferable processing is possible under a temperature condition of as low as 530° C. or below, for example, 400° C. The low temperature treatment prevents hydrogen in the silicon nitride film from desorbing and diffusing to the lower silicon oxide film. Furthermore, by generating only the N* radical as a radical, plasma processing can be conducted without using hydrogen as a raw material gas.

Subsequently, as shown in FIG. 1C, a surface layer of the silicon nitride film 104 is completely oxidized by the aforementioned plasma oxidizing method to be replaced by an upper silicon oxide film 105. An ONO film 111 as a multilayered insulating film composed of the lower silicon oxide film 102, the silicon nitride film 104, and the upper silicon oxide film 105 is formed. A preferable processing is possible under a temperature condition of as low as 530° C. or below, for example, 400° C. when the upper silicon oxide film 105 is formed. Furthermore, by generating only the O* radical as a radical, plasma processing can be conducted without using hydrogen as a raw material gas.

At this time, by the aforementioned plasma oxidizing method, a gate insulation film 112 may be preferably formed in a peripheral circuit region of a semiconductor substrate simultaneously with the upper silicon oxide film 105. This makes heat history lower and shorter period of time, thereby miniaturizing elements. In this case, unlike the case when the gate insulation film in the peripheral circuit region is formed after the ONO film is formed, the gate insulation film 112 is simultaneously formed by plasma oxidization for forming the upper silicon oxide film 105 while the ONO film 111 is formed (in a state that the lower silicon oxide film 102 and the silicon nitride film 104 are formed). Therefore, strong oxidizing power due to plasma oxidization does not have to be concerned.

Here, an effect of the strong oxidizing power on the upper silicon oxide film 105 due to the plasma oxidization does not have to be concerned, because simultaneous oxidization of the above-mentioned films does not perform excessively, although a film thickness of the films needs to be controlled. Oxidization by reaching of the radical to the lower silicon oxide film 102 which is a base does not need to be concerned because an appropriate film thickness is selected. When the upper silicon oxide film 105 is formed, a total film thickness of the lower silicon oxide film 102 and the silicon nitride film 104 is preferably approximately 15 nm or more.

-Second Aspect-

Figure 2A:
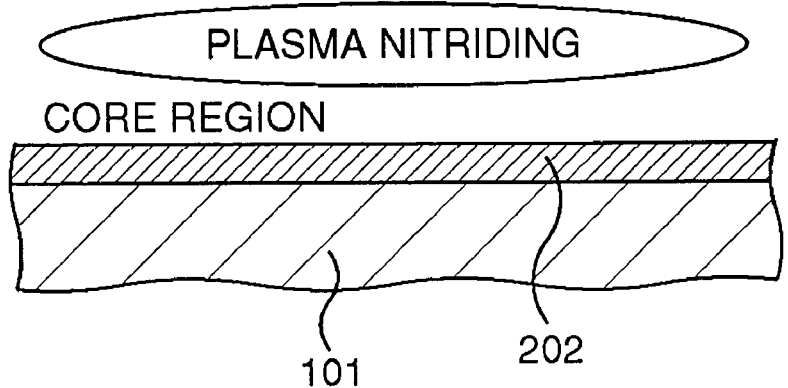
FIG. 2A and FIG. 2B are diagrammatic cross sectional views for explaining a second aspect of the present invention.
Figure 2B:
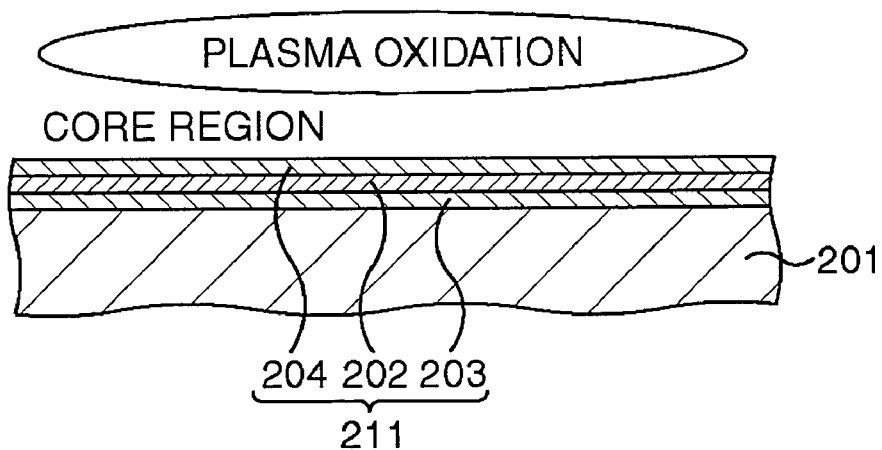
Figure 2B:
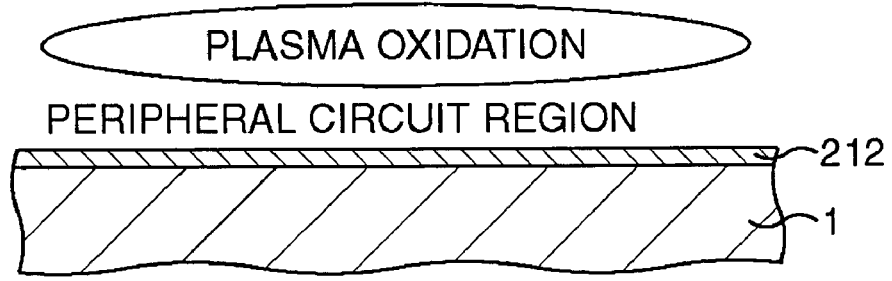

Next, a second aspect will be explained. FIG. 2A and FIG. 2B are diagrammatic views for explaining the second aspect. Here, an explanation is also given with an example that an ONO film is formed in a memory cell region, and that a gate insulation film is formed in a peripheral circuit region.

In this embodiment, firstly, as shown in FIG. 2A, a surface layer of a silicon region 201 which is a memory cell region of a silicon semiconductor substrate, or is a polycrystalline silicon film or an a-Si film (for example, an island-shaped floating gate) formed in the memory cell region, is completely nitrided to form a silicon nitride film 202 by the aforementioned plasma nitriding method. A preferable processing is possible under a temperature condition of as low as 530° C. or below, for example, 400° C. The low temperature treatment prevents hydrogen in the silicon nitride film from desorbing and diffusing to the lower silicon oxide film. Furthermore, by generating only the N* radical as a radical, plasma processing can be conducted without using hydrogen as a raw material gas.

Subsequently, as shown in FIG. 2B, a surface layer of the silicon nitride film 202 is oxidized by the aforementioned plasma oxidizing method. The silicon nitride film 202 is formed to have a film thickness of 15 nm or below by the aforementioned plasma nitriding so as to oxidize not only the surface layer of the silicon nitride film 202 but also an interface of the silicon region 201 facing with the silicon nitride film 202. Therefore, an ONO film 211 as a multilayered insulating film composed of the lower silicon oxide film 203, the silicon nitride film 202, and the upper silicon oxide film 204 is formed. A preferable processing is possible under a temperature condition of as low as 530° C. or below, for example, 400° C. when the lower silicon oxide film 203 and the upper silicon oxide film 204 are formed. Furthermore, by generating only the O* radical as a radical, plasma processing can be conducted without using hydrogen as a raw material gas.

At this time, as is the case with the first embodiment, by the aforementioned plasma oxidizing method, a gate insulation film 212 may be formed in a peripheral circuit region of a semiconductor substrate simultaneously with the lower silicon oxide film 203 and the upper silicon oxide film 204. This makes heat history lower and shorter period of time, thereby miniaturizing elements. In this case, unlike the case when the gate insulation film in the peripheral circuit region is formed after the ONO film is formed, the gate insulation film 212 is simultaneously formed by plasma oxidization for forming the lower silicon oxide film 203 and the upper silicon oxide film 204 while the ONO film 211 is formed (in a state that the silicon nitride film 202 is formed). Therefore, strong oxidizing power due to the plasma oxidization can be utilized.

In this embodiment, when the ONO film is formed, a nitrided film and an oxide film are directly formed from silicon without using a CVD method at all. Therefore, an ONO film of low leakage current and extreme high quality can be formed.

-Third Aspect-

Figure 3A:
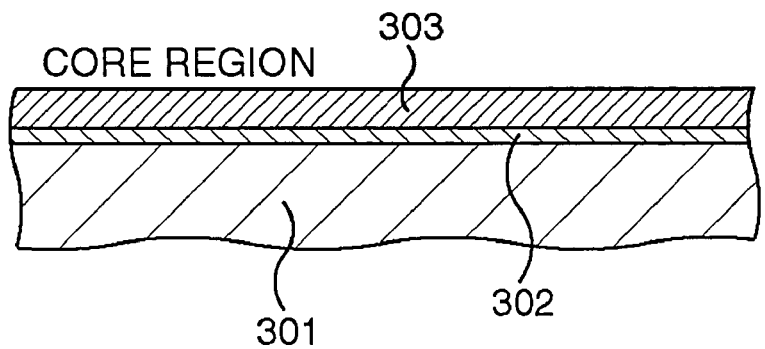
FIG. 3A and FIG. 3B are diagrammatic cross sectional views for explaining a third aspect of the present invention.
Figure 3B:
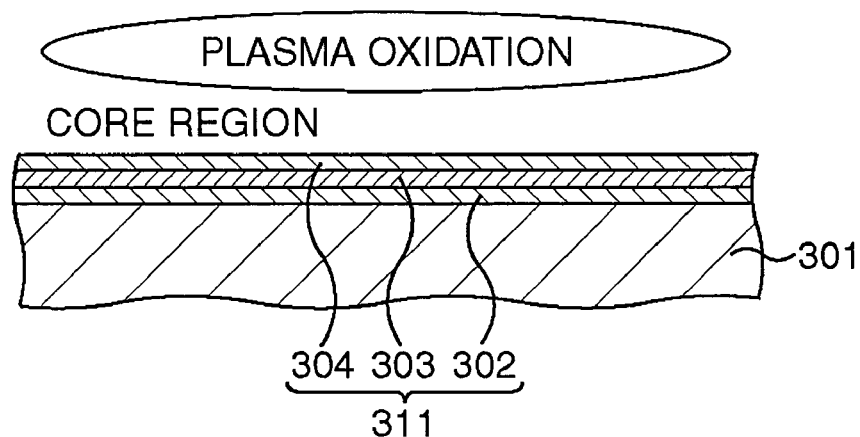
Figure 3B:
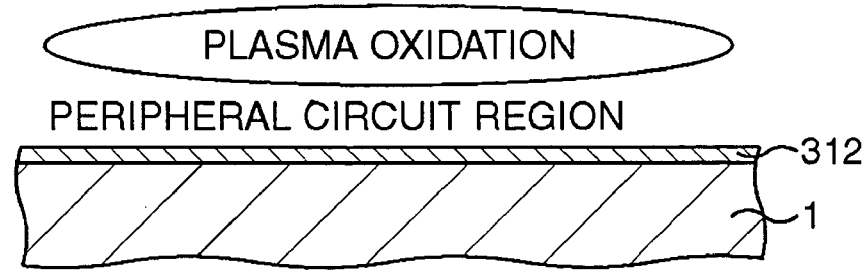

Next, a third aspect will be explained. FIG. 3A and FIG. 3B are diagrammatic views for explaining the third aspect. Here, an explanation is also given with an example that an ONO film is formed in a memory cell region, and that a gate insulation film is formed in a peripheral circuit region.

In this embodiment, firstly, as shown in FIG. 3A, after a lower silicon oxide film 302 is formed on a silicon region 301 which is a memory cell region of a silicon semiconductor substrate, or is a polycrystalline silicon film or an a-Si film (for example, an island-shaped floating gate) formed in the memory cell region, a silicon nitride film 303 is formed on the lower silicon oxide film 302 by, for example, a thermal CVD method or a plasma CVD method. The silicon nitride film formed by the CVD method contains many lattice defects, and therefore, it is suitable when used as a charge-storage film.

Subsequently, as shown in FIG. 3B, a surface layer of the silicon nitride film 303 is oxidized by the aforementioned plasma oxidizing method to be replaced by an upper silicon oxide film 304. An ONO film 311 as a multilayered insulating film composed of the lower silicon oxide film 302, the silicon nitride film 303, and the upper silicon oxide film 304 is formed. A preferable processing is possible under a temperature condition of as low as 530° C. or below, for example, 400° C. when the upper silicon oxide film 304 is formed. Furthermore, by generating only the O* radical as a radical, plasma processing can be conducted without using hydrogen as a raw material gas.

At this time, by the aforementioned plasma oxidizing method, a gate insulation film 312 may be formed in a peripheral circuit region of a semiconductor substrate simultaneously with the upper silicon oxide film 304. This makes heat history lower and shorter period of time, thereby miniaturizing elements. In this case, unlike the case when the gate insulation film in the peripheral circuit region is formed after the ONO film is formed, the gate insulation film 312 is simultaneously formed by plasma oxidization for forming the upper silicon oxide film 304 while the ONO film 311 is formed (in a state that the lower silicon oxide film 302 and the silicon nitride film 303 are formed). Therefore, strong oxidizing power due to the plasma oxidization can be utilized.

-Specific Embodiments-

Specific embodiments are explained below based on the aforementioned basic structure of the present invention.

-First Embodiment-

In this embodiment, a semiconductor memory device having an embedded bit line type SONOS structure will be disclosed. A structure of the semiconductor memory device is explained with a method for manufacturing thereof as a matter of convenience.

This semiconductor memory device is so structured that SONOS transistors in a memory cell region are of a planer type and that CMOS transistors are formed in a peripheral circuit region.

FIG. 4A to FIG. 13B are schematic cross sectional views showing a method for manufacturing the semiconductor memory device including embedded bit line type SONOS transistors in this embodiment in the order of processes. Here, each A of the drawings shows a memory cell region (a core region), and each B thereof shows a peripheral circuit region. The left side of the A thereof corresponds to a cross section (an X section) taken along the parallel line to a gate electrode (a word line), and the right side corresponds to a cross section (a Y section) taken along the perpendicular line to the gate electrode.

Figure 4A:
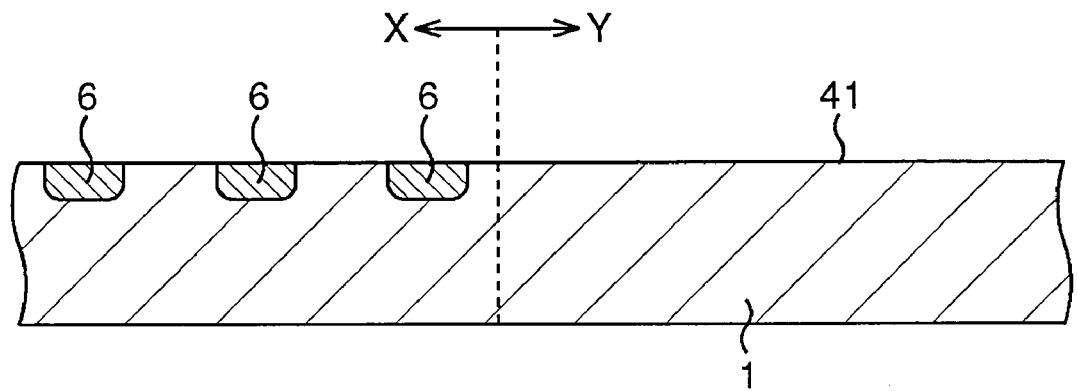
FIG. 4A and FIG. 4B are schematic cross sectional views showing a method for manufacturing a semiconductor memory device including embedded bit line type SONOS transistors in a first embodiment in the order of processes.
Figure 4B:
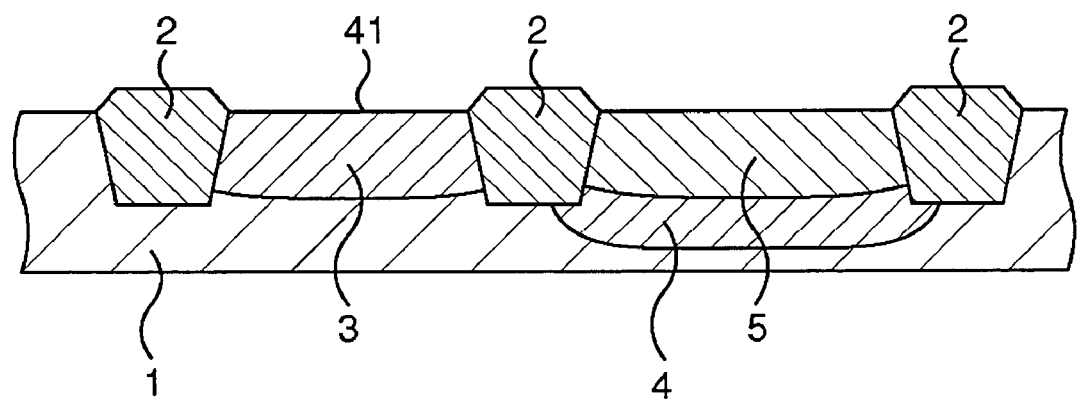

First, as shown in FIG. 4A and FIG. 4B, element isolation structures are formed in a peripheral circuit region 12 to demarcate element active regions.

Here, by a so-called STI (Shallow Trench Isolation) method, trenches are formed in element isolation regions in the peripheral circuit region 12 of a p-type silicon semiconductor substrate 1. Furthermore, STI element isolation structures 2 are formed by filling the trenches with insulators so as to demarcate the element active regions. Incidentally, since a planar-type memory is disclosed in this embodiment, element isolation structures are not formed in the core region.

Subsequently, wells 3, 4, and 5 are formed in the peripheral circuit region 12.

Specifically, in an n-type region, n-type impurities such as phosphorus (P), arsenic (As), or the like are ion-implanted into only an n-type region of the peripheral circuit region 12, and the impurities are thermally diffused by annealing treatment to form the n-well 3 in the n-type region. On the other hand, in a p-type region, the n-type impurities such as phosphorus (P), arsenic (As), or the like are deeply ion-implanted into only a p-type region of the peripheral circuit region 12, and a p-type impurity such as boron (B) is less shallowly ion-implanted than the n-type impurities. Then, the impurities are thermally diffused by annealing treatment to form the deep n-well 4 and the p-well 5 in the n-well 4 so as to form a triple-well structure in the p-type region.

Subsequently, bit-line diffusion layers 6 are formed in a core region 11 of the semiconductor substrate 1.

Specifically, resist masks (not shown) in a bit-line shape are formed by lithography, and using them as masks, an n-type impurity, arsenic (As) in this example, is ion-implanted. Here, it is ion-implanted with a dose amount of $2.0 \times 10^{14}$ (/cm$^2$) or more in order to lower bit-line resistance. Through these processes, the bit-line diffusion layers 6 also serving as sources/drains are formed.

Subsequently, after the resist masks are removed by ashing treatment or the like, a resist mask (not shown) covering only the p-type region of the peripheral circuit region 12 is formed. Furthermore, using this as a mask, ion-implantation of boron (B) for threshold value adjustment is conducted (shown as a reference numeral 41). Incidentally, this ion-implantation is not limited to the p-type region, and is applicable to the n-type region.

Subsequently, after the resist mask is removed by ashing treatment or the like, and after silicon surfaces of the respective element active regions in the core region 11 and the peripheral circuit region 12 are exposed by HF treatment, an ONO film as a multilayered insulating film is formed.

Here, a plasma oxidizing method and a plasma nitriding method through microwave excitation are used for forming the ONO film.

Figure 14:
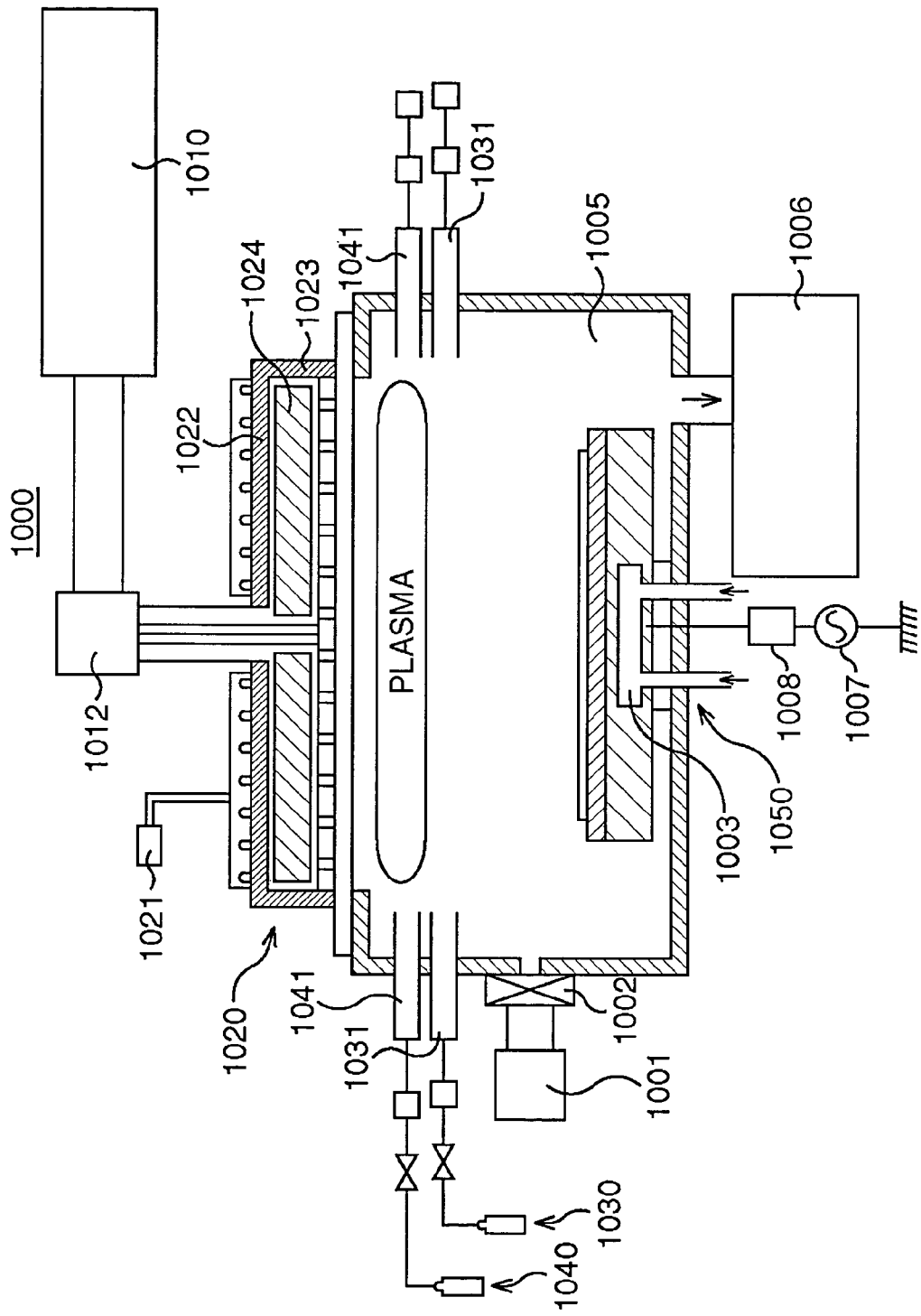
FIG. 14 is a diagrammatic view showing a schematic configuration of a plasma processor provided with a radial line slot antenna used for every embodiment.

Specifically, a plasma processor, as shown in FIG. 14, provided with a radial line slot antenna, is used for plasma oxidizing and plasma nitriding. This plasma processor 1000 includes a gate valve 1002 communicating with a cluster tool 1001, a process chamber 1005 capable of accommodating a susceptor on which an object to be processed (the semiconductor substrate 1 in this embodiment) is to be mounted and which is provided with a cooling jacket 1003 for cooling the object to be processed at the time of plasma processing, a high-vacuum pump 1006 connected to the process chamber 1005, a microwave supply source 1010, an antenna member 1020, a bias high-frequency power source 1007 and a matching box 1008 constituting an ion plating apparatus together with this antenna member 1020, gas supply systems 1030, 1040 having gas supply rings 1031, 1041, and a temperature control section 1050 for controlling the temperature of the object to be processed.

The microwave supply source 1010 is made from, for example, magnetron and is generally capable of generating a microwave (for example, 5 kW) of 2.45 GHz. The transmission mode of the microwave is thereafter converted to a TM, TE, TEM mode or the like by a mode converter 1012.

The antenna member 1020 has a temperature-adjusting plate 1022, an accommodating member 1023, and a dielectric plate. The temperature-adjusting plate 1022 is connected to a temperature control unit 1021, and the accommodating member 1023 accommodates a wavelength shortening material 1024 and a slot electrode (not shown) being in contact with the wavelength shortening material 1024. This slot electrode is called a radial line slot antenna (RLSA) or an ultra-high efficiency flat antenna. In this embodiment, however, a different type of antenna, for example, a single-layer waveguide flat antenna, a dielectric substrate parallel plane slot array, or the like may be applied.

Figure 5A:
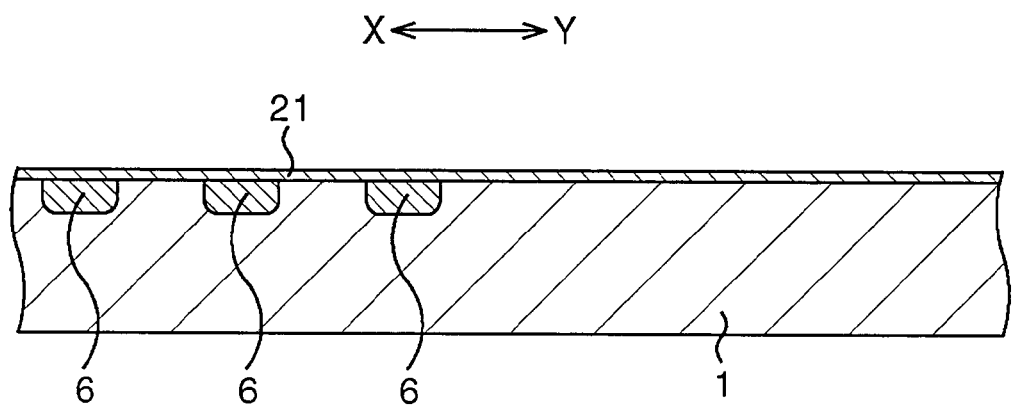
FIG. 5A and FIG. 5B are schematic cross sectional views, subsequent to FIG. 4A and FIG. 4B, showing the method for manufacturing the semiconductor memory device including the embedded bit line type SONOS transistors in the first embodiment in the order of processes.
Figure 5B:
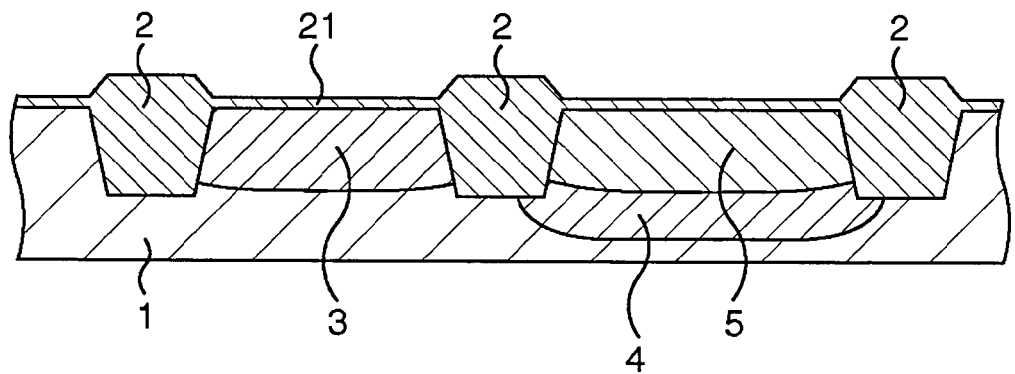

In forming the ONO film of this embodiment using the plasma processor as structured above, as shown in FIG. 5A and FIG. 5B, lower silicon oxide films 21 are firstly formed on silicon surfaces of the element active regions by a plasma oxidizing method.

Specifically, using a source gas containing Ar and O$_2$ but not hydrogen, oxidizing processing is conducted by generating an oxygen radical (O*) by irradiating the source gas with a microwave of 3.5 kW under a temperature condition of 450° C. so as to form the lower silicon oxide films 21. It should be noted that the lower silicon oxide films might be formed by a thermal oxidation method or a CVD oxide method instead of the plasma oxidizing.

Figure 6A:
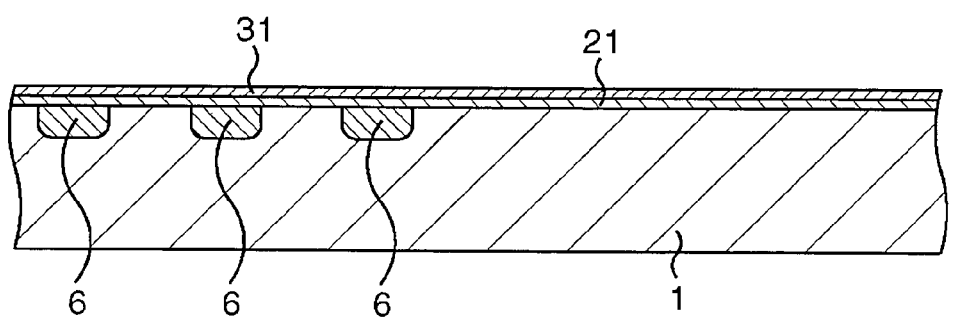
FIG. 6A and FIG. 6B are schematic cross sectional views, subsequent to FIG. 5A and FIG. 5B, showing the method for manufacturing the semiconductor memory device including the embedded bit line type SONOS transistors in the first embodiment in the order of processes.
Figure 6B:
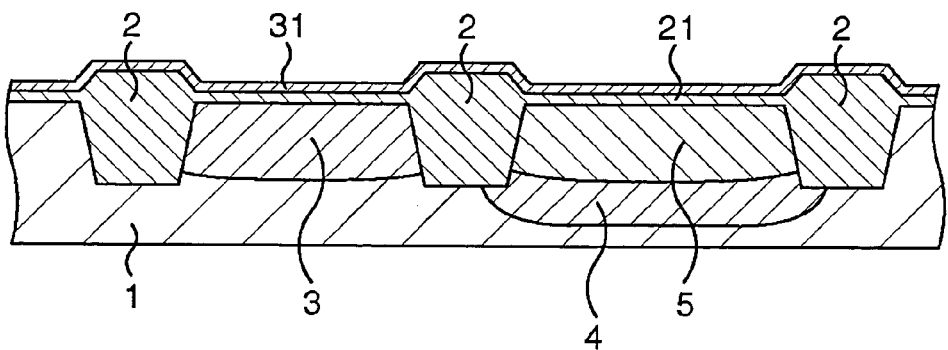

Subsequently, as shown in FIG. 6A and FIG. 6B, amorphous silicon (a-Si) films 31 are deposited to have a film thickness of approximately 9 nm on the lower silicon oxide films 21 by a thermal CVD method under a temperature condition of 530° C., using SiH$_4$ as a raw material gas. Here, polycrystalline silicon films may be formed instead of the a-Si films.

Figure 7A:
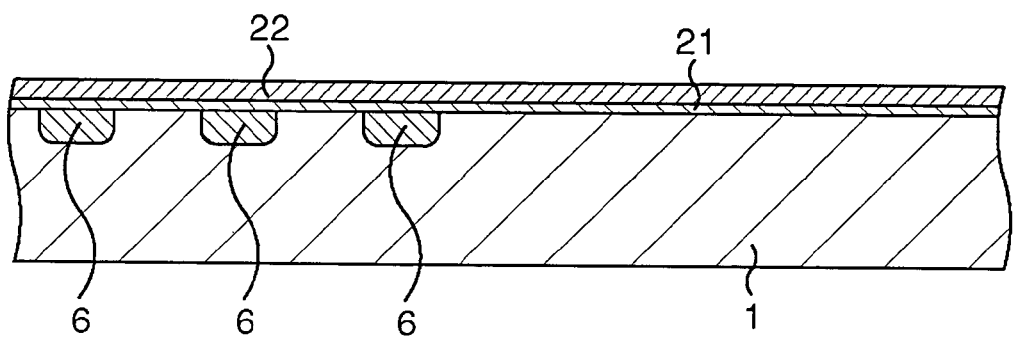
FIG. 7A and FIG. 7B are schematic cross sectional views, subsequent to FIG. 6A and FIG. 6B, showing the method for manufacturing the semiconductor memory device including the embedded bit line type SONOS transistors in the first embodiment in the order of processes.
Figure 7B:
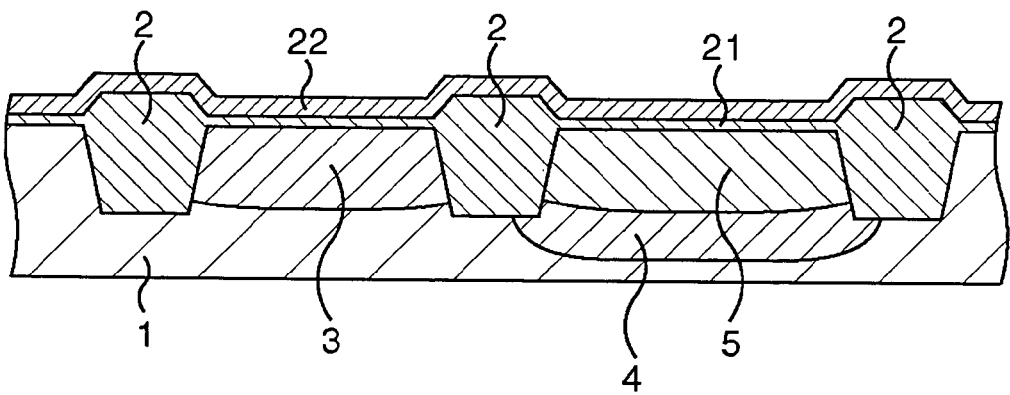

Next, as shown in FIG. 7A and FIG. 7B, the a-Si films 31 are completely nitrided by a plasma nitriding method to form silicon nitride films 22 on the lower silicon oxide films 21.

Specifically, using a source gas containing N$_2$ and Ar but not hydrogen, nitriding processing is conducted by generating a nitrogen radical (N*) by irradiating the source gas with a microwave of 3.5 kW under a temperature condition of 450° C. The a-Si films 31 having a film thickness of approximately 9 nm are completely nitrided to be replaced by the silicon nitride films 22 having a film thickness of approximately 18 nm.

Subsequently, surface layers of the silicon nitride films 22 are oxidized by a plasma oxidizing method to form upper silicon oxide films. In this embodiment, by the plasma oxidization, gate insulation films are respectively formed in the peripheral circuit region 12 with the upper silicon oxide film in the core region 11.

Figure 8A:
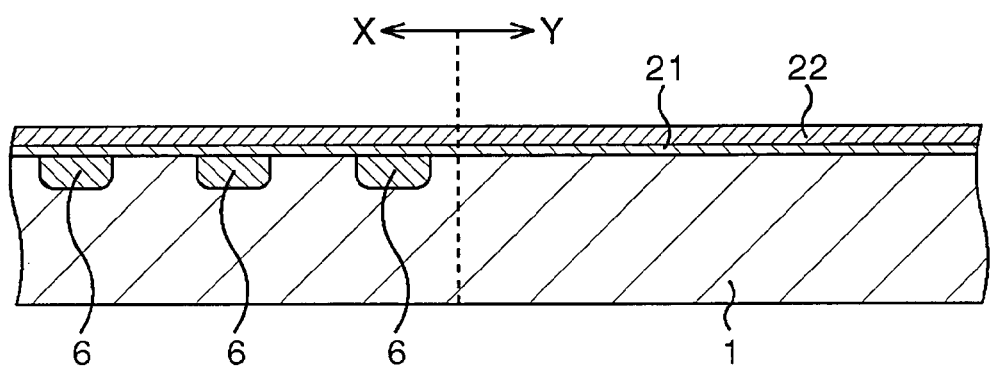
FIG. 8A and FIG. 8B are schematic cross sectional views, subsequent to FIG. 7A and FIG. 7B, showing the method for manufacturing the semiconductor memory device including the embedded bit line type SONOS transistors in the first embodiment in the order of processes.
Figure 8B:
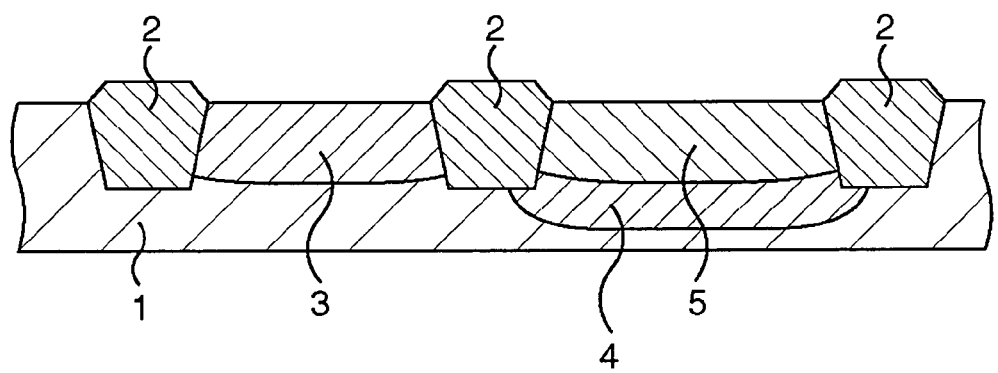

Specifically, as shown in FIG. 8A and FIG. 8B, only the core region 11 is covered with a resist mask (not shown), and using it as a mask, the silicon nitride film 22 formed in the peripheral circuit region 12 is removed by dry etching. Subsequently, the lower silicon oxide film 21 formed in the peripheral circuit region 12 is removed by HF treatment so as to expose the surface of the semiconductor substrate 1 in the peripheral circuit region 12.

Figure 9A:
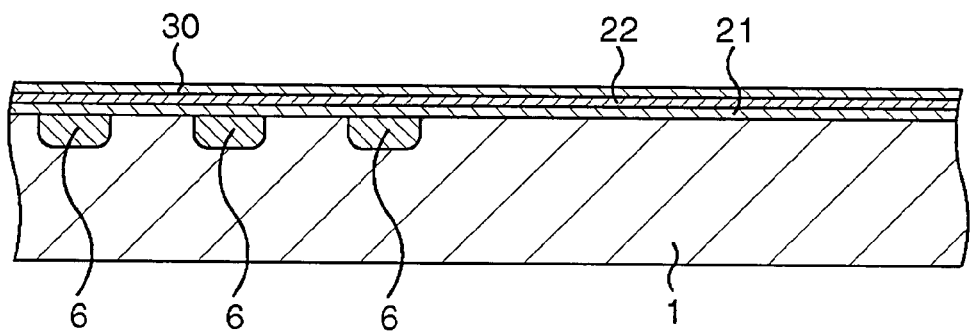
FIG. 9A and FIG. 9B are schematic cross sectional views, subsequent to FIG. 8A and FIG. 8B, showing the method for manufacturing the semiconductor memory device including the embedded bit line type SONOS transistors in the first embodiment in the order of processes.
Figure 9B:
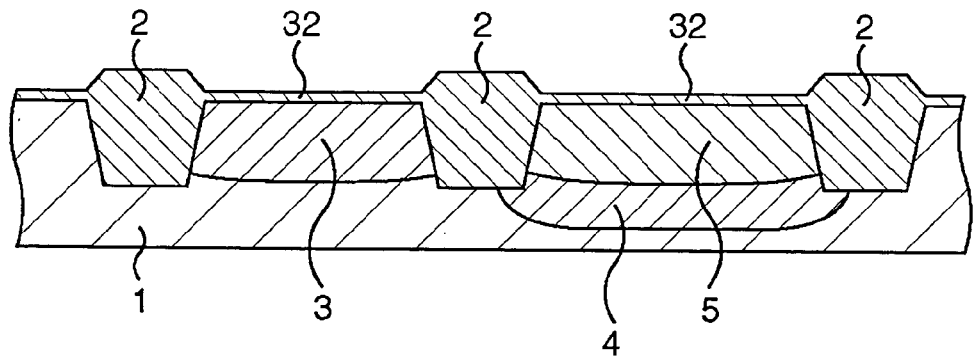

Subsequently, after the resist mask is removed by ashing treatment or the like, as shown in FIG. 9A and FIG. 9B, using a source gas containing Ar and O$_2$ but not hydrogen, oxidizing processing is conducted by generating an oxygen radical (O*) by irradiating the source gas with a microwave of 3.5 kW under a temperature condition of 450° C. A silicon oxide film 30 is formed by oxidizing a surface layer of the silicon nitride film 22 in the core region 11. Simultaneously, a silicon oxide film 32 having a film thickness of approximately 8 nm is formed in the peripheral circuit region 12.

Figure 10A:
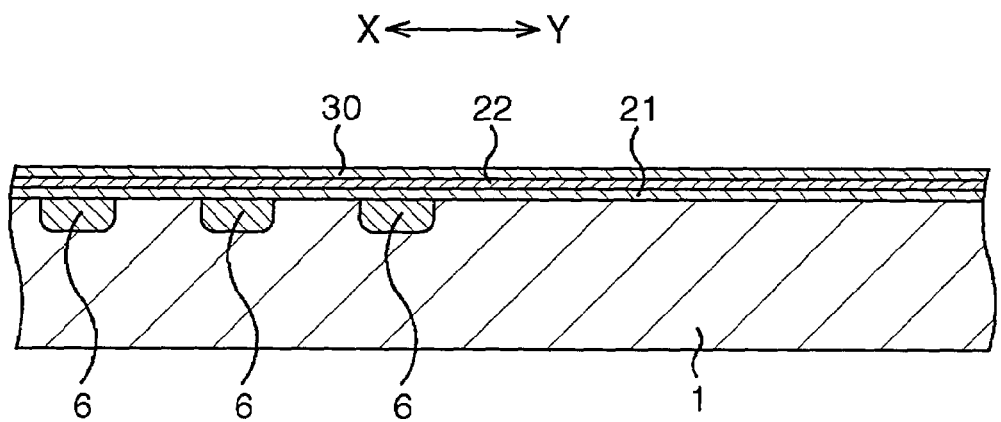
FIG. 10A and FIG. 10B are schematic cross sectional views, subsequent to FIG. 9A and FIG. 9B, showing the method for manufacturing the semiconductor memory device including the embedded bit line type SONOS transistors in the first embodiment in the order of processes.
Figure 10B:
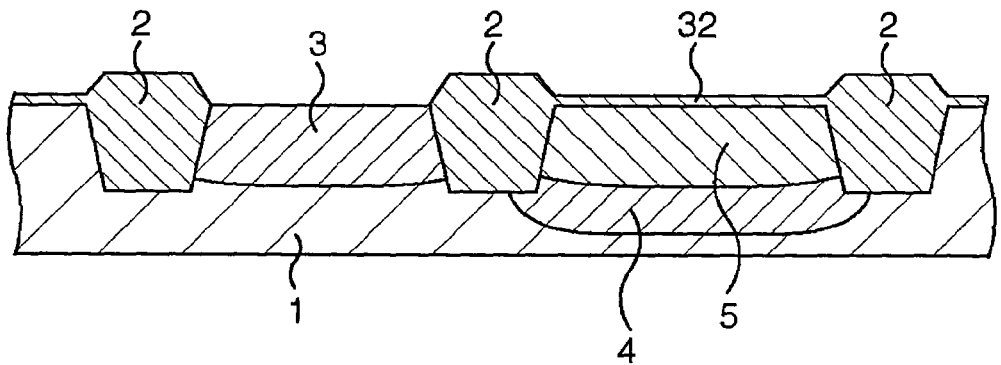

Subsequently, as shown in FIG. 10A and FIG. 10B, a part for forming a thin gate insulation film in the peripheral circuit region 12, that is, a resist mask (not shown) for exposing only the n-type region, is formed. HF treatment is conducted using it as a mask, thereby removing the silicon oxide film 32 in the n-type region.

Figure 11A:
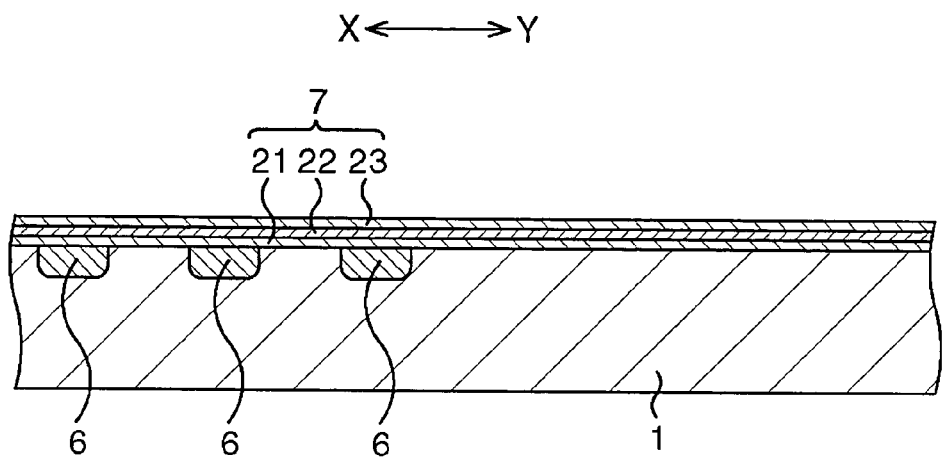
FIG. 11A and FIG. 11B are schematic cross sectional views, subsequent to FIG. 10A and FIG. 10B, showing the method for manufacturing the semiconductor memory device including the embedded bit line type SONOS transistors in the first embodiment in the order of processes.
Figure 11B:
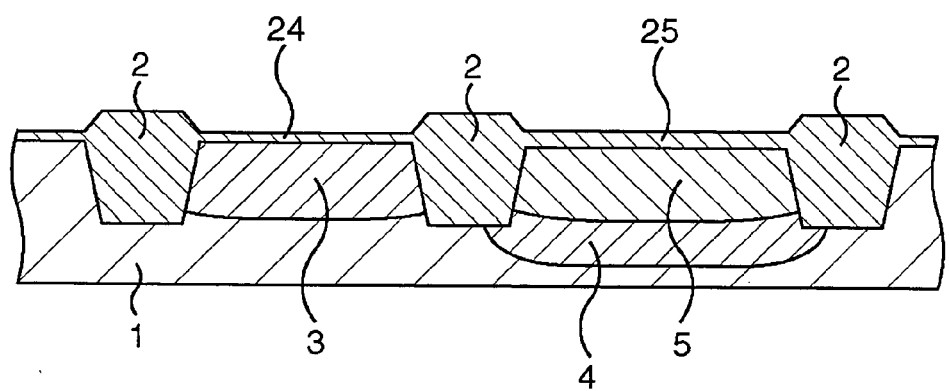

Subsequently, after the resist mask is removed by ashing treatment or the like, as shown in FIG. 11A and FIG. 11B, oxidizing processing is conducted by the aforementioned plasma oxidizing method so as to form a silicon oxide film having a film thickness of approximately 7 nm on a surface of the exposed semiconductor substrate 1. At this time, in the core region 11, the surface layer of the silicon nitride film 22 is further oxidized and replaced by a silicon oxide film, and as a result, an upper silicon oxide film 23 having a film thickness of approximately 10 nm is formed. Simultaneously, in the peripheral circuit region 12, a thin gate insulation film 24 having a film thickness of approximately 7 nm is formed in the n-type region. Furthermore, a gate insulation film 25 having a film thickness of approximately 13 nm is formed in the p-type region by plasma oxidization having a film thickness of approximately 7 nm after plasma oxidization having a film thickness of aforementioned 8 nm (the silicon oxide film 32).

In the core region 11, an ONO film 7 is thus composed of the lower silicon oxide film 21 having a film thickness of approximately 8 nm formed by plasma oxidization, the silicon nitride film 22 having a film thickness of approximately 8 nm formed by plasma nitriding as a charge-storage film whose surface layer is reduced by plasma oxidization twice, and the upper silicon oxide film 23 formed by plasma oxidization. On the other hand, in the peripheral circuit region 12, a thin gate insulation film 24 having a film thickness of approximately 8 nm in the n-type region and a gate insulation film 25 having a film thickness of approximately 13 nm in the p-type region are respectively formed.

Figure 12A:
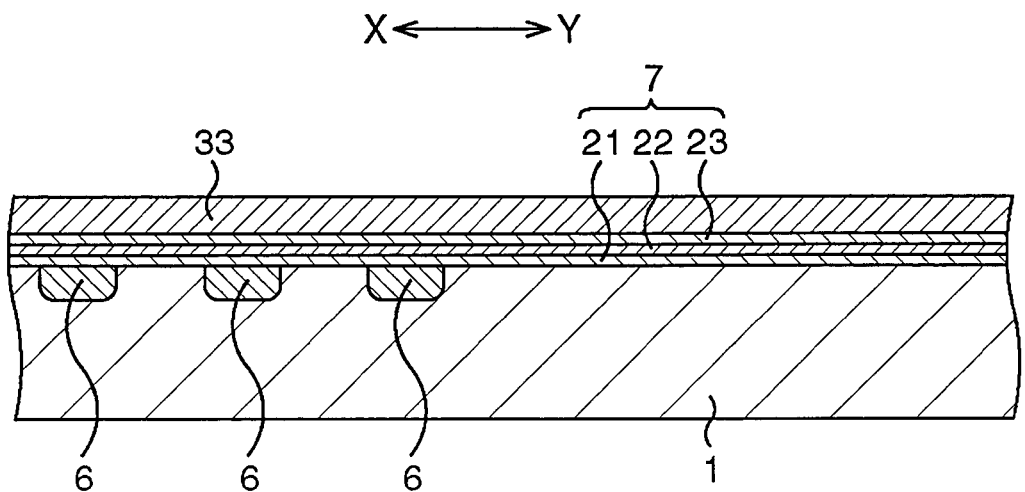
FIG. 12A and FIG. 12B are schematic cross sectional views, subsequent to FIG. 11A and FIG. 11B, showing the method for manufacturing the semiconductor memory device including the embedded bit line type SONOS transistors in the first embodiment in the order of processes.
Figure 12B:
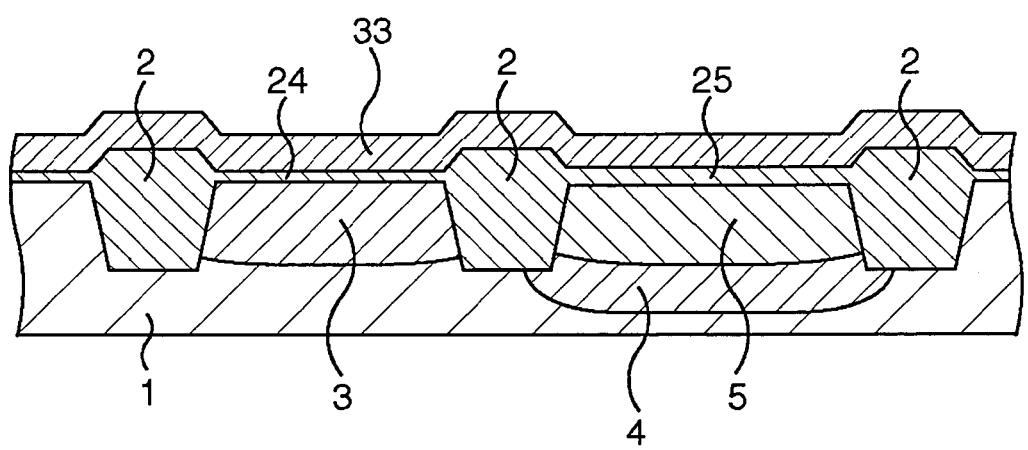

Subsequently, as shown in FIG. 12A and FIG. 12B, polycrystalline silicon films 33 are formed on entire surfaces of the core region 11 and the peripheral circuit region 12 by a CVD method.

Figure 13A:
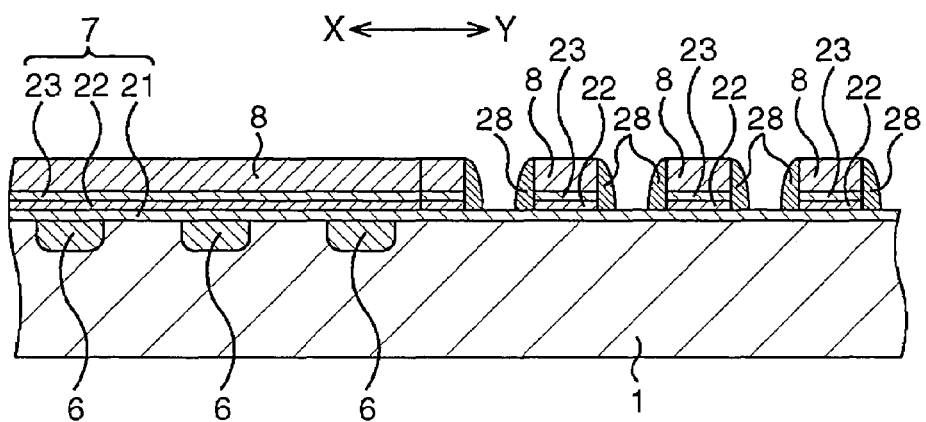
FIG. 13A and FIG. 13B are schematic cross sectional views, subsequent to FIG. 12A and FIG. 12B, showing the method for manufacturing the semiconductor memory device including the embedded bit line type SONOS transistors in the first embodiment in the order of processes.
Figure 13B:
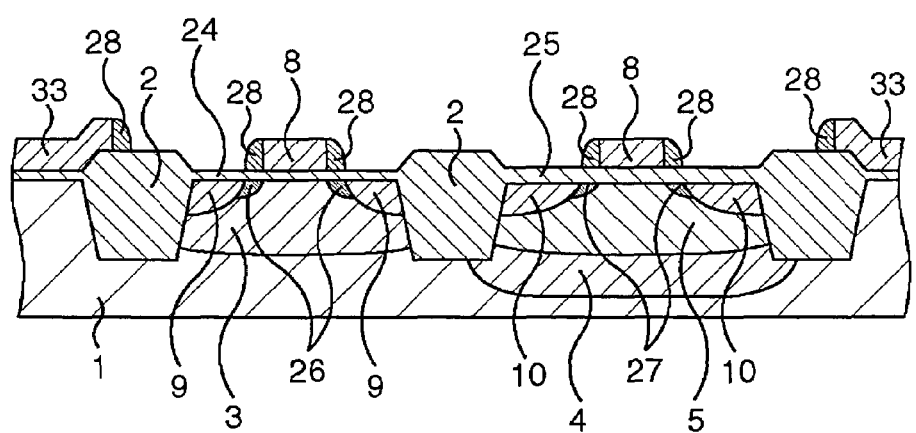

Subsequently, as shown in FIG. 13A and FIG. 13B, the polycrystalline silicon films 33 are patterned by lithography followed by dry etching to form gate electrodes 8 in the core region 11, and the n-type region and the p-type region of the peripheral circuit region 12, respectively. At this time, these gate electrodes 8 in the core region 11 are formed to cross the bit line diffusion layers 6 substantially perpendicularly.

Subsequently, sources/drains 9 and 10 are formed only in the peripheral circuit region 12.

Specifically, n-type impurities are ion-implanted into the surface of the semiconductor substrate 1 on both sides of the gate electrode 8 in the n-type region to form extension regions 26. Meanwhile, in the p-type region, p-type impurities are ion-implanted into the surface of the semiconductor substrate 1 on both sides of the gate electrode 8 to form extension regions 27.

Next, after a silicon oxide film is deposited over an entire surface by a CVD method, the entire surface of the silicon oxide film is antisotropically etched (etch back) so as to leave only the silicon oxide films on both sides of the respective gate electrodes 8, thereby forming sidewalls 28.

Then, in the n-type region, n-type impurities are ion-implanted into the surface of the semiconductor substrate 1 on both sides of the gate electrodes 8 and the sidewalls 28 to form the deep sources/drains 9 which partly overlap the extension regions 26. Meanwhile, in the p-type region, p-type impurities are ion-implanted into the surface of the semiconductor substrate 1 on both sides of the gate electrode 8 and the sidewalls 28 to form the deep sources/drains 10 which partly overlap the extension regions 27. At this time, surfaces of the sources/drains 9 and 10 may be exposed so as to form siliside layers on the sources/drains 9 and 10, and on the gate electrodes 8 in the peripheral circuit region 12 by conducting salicide process.

Thereafter, a several-layered interlayer dielectric covering the entire surface, contact holes, via holes, various kinds of wiring layers, and so on are formed, and a protective insulation film (none of them are shown) is formed on a top layer so that, on the semiconductor substrate 1, many semiconductor memory devices provided with a peripheral circuit including SONOS type memory cells and the CMOS transistors are formed. Then, an individual semiconductor memory device is manufactured by separating and packaging the above-mentioned devices.

As explained above, according to the present embodiment, the ONO film 7 functioning as a charge-storage film is formed of high quality and in low temperature, and furthermore, the gate insulation films 24 and 25 in the peripheral circuit are successfully formed with the ONO film 7. This makes it possible to realize a SONOS type semiconductor memory device of high reliability and low cost.

-Second Embodiment-

In this embodiment, a floating gate type semiconductor memory device will be disclosed. A structure of the semiconductor memory device is explained with a method for manufacturing thereof as a matter of convenience.

The floating gate type transistors are formed in a memory cell region, and CMOS transistors are formed in a peripheral circuit region.

FIG. 15A to FIG. 26B are schematic cross sectional views showing a method for manufacturing the semiconductor memory device including the floating gate type transistors in this embodiment in the order of processes. It should be noted that, for convenience, the same reference numerals are given to the components or the like explained in the first embodiment. Here, each A of the drawings except FIG. 20 shows a memory cell region (a core region), and each B thereof shows a peripheral circuit region. The left side of the A thereof corresponds to a cross section (an X section) taken along the parallel line to a control gate (a word line), and the right side corresponds to a cross section (a Y section) taken along the perpendicular line to the control gate. FIG. 20 corresponds to the X section.

Figure 15A:
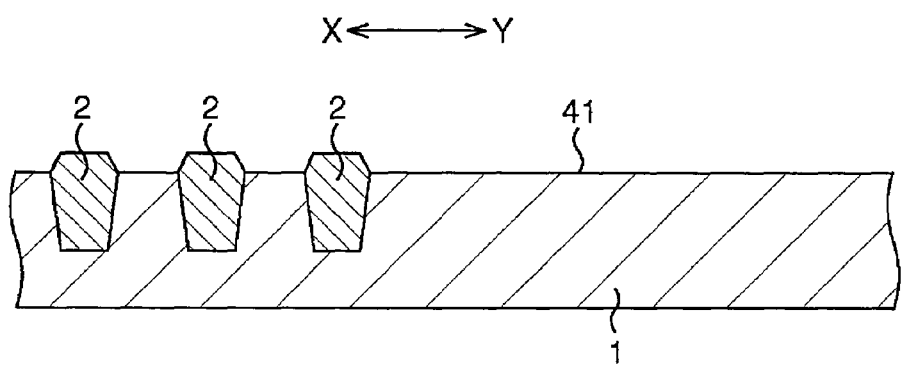
FIG. 15A and FIG. 15B are schematic cross sectional views showing a method for manufacturing a semiconductor memory device including floating gate type transistors in a second embodiment in the order of processes.
Figure 15B:
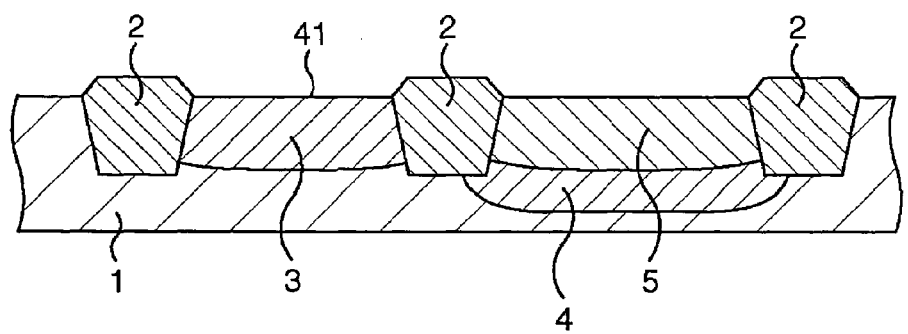

First, as shown in FIG. 15A and FIG. 15B, element isolation structures are respectively formed in a core region 11 and a peripheral circuit region 12 to demarcate element active regions.

Here, by a so-called STI (Shallow Trench Isolation) method, trenches are formed in element isolation regions in the core region 11 and the peripheral circuit region 12 of a p-type silicon semiconductor substrate 1. Furthermore, STI element isolation structures 2 are formed by filling the trenches with insulators so as to demarcate the element active regions.

Subsequently, wells 3, 4, and 5 are formed in the peripheral circuit region 12.

Specifically, in an n-type region, n-type impurities such as phosphorus (P), arsenic (As), or the like are ion-implanted into only an n-type region of the peripheral circuit region 12, and the impurities are thermally diffused by annealing treatment to form the n-well 3 in the n-type region. On the other hand, in a p-type region, the n-type impurities such as phosphorus (P), arsenic (As), or the like are deeply ion-implanted into only a p-type region of the peripheral circuit region 12, and a p-type impurity such as boron (B) is less shallowly ion-implanted than the n-type impurities. Then, the impurities are thermally diffused by annealing treatment to form the deep n-well 4 and the p-well 5 in the n-well 4 so as to form a triple-well structure in the p-type region.

Subsequently, a resist mask (not shown) covering only the p-type region of the peripheral circuit region 12 is formed. Furthermore, using this as a mask, ion-implantation of boron (B) for threshold value adjustment is conducted (shown as a reference numeral 41). Incidentally, this ion-implantation is not limited to the p-type region, and is applicable to the n-type region.

Figure 16A:
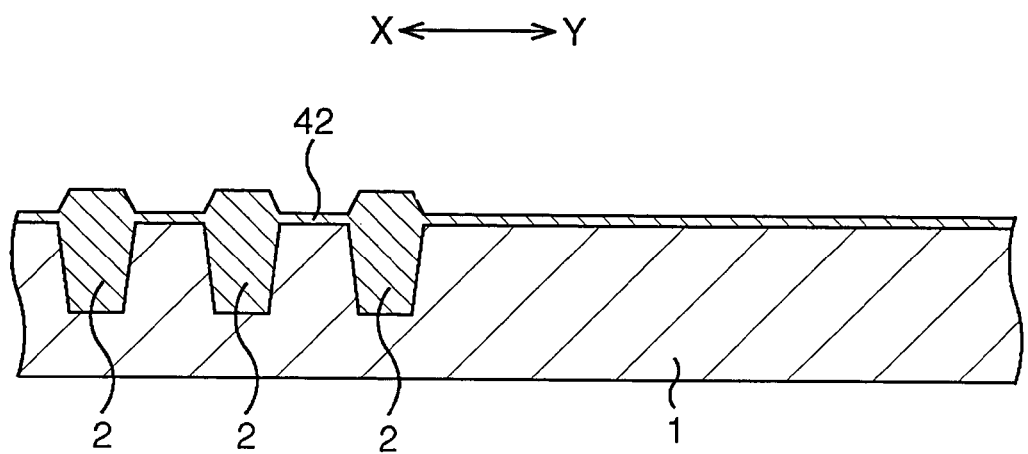
FIG. 16A and FIG. 16B are schematic cross sectional views, subsequent to FIG. 15A and FIG. 15B, showing the method for manufacturing the semiconductor memory device including the floating gate type transistors in the second embodiment in the order of processes.
Figure 16B:
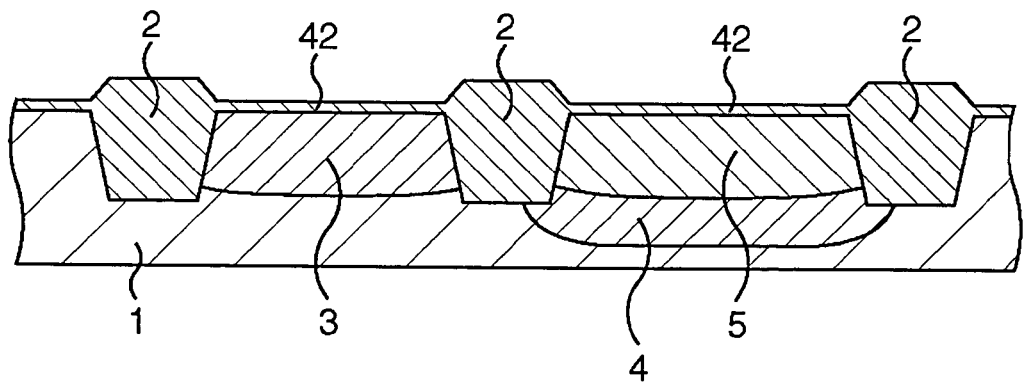

Subsequently, as shown in FIG. 16A and FIG. 16B, after the resist mask is removed by ashing treatment or the like, silicon surfaces of the respective element active regions in the core region 11 and the peripheral circuit region 12 are exposed by HF treatment. Subsequently, tunnel oxide films 42 having a film thickness of approximately 10 nm are formed in the respective element active regions by thermal oxidation. In view of lowering the temperature, the aforementioned plasma oxidizing method is also suitable for forming the tunnel oxide films instead of a thermal oxidation method.

Figure 17A:
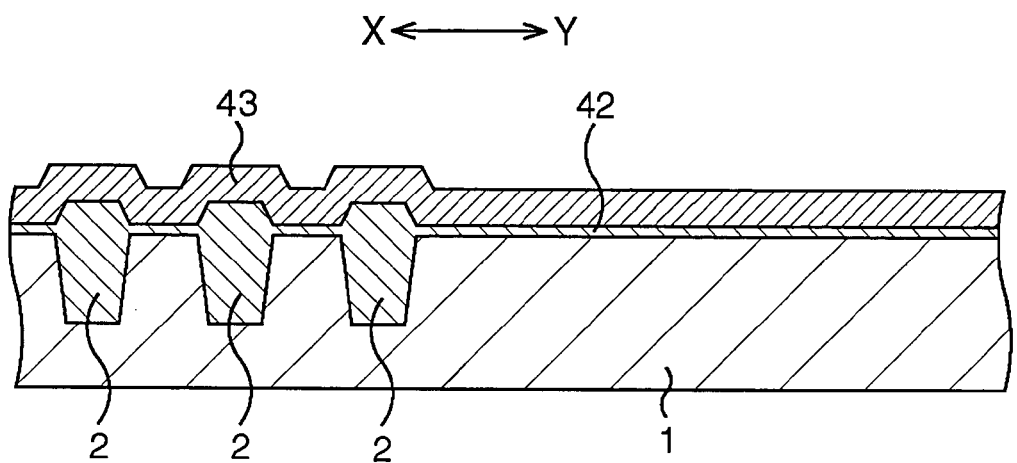
FIG. 17A and FIG. 17B are schematic cross sectional views, subsequent to FIG. 16A and FIG. 16B, showing the method for manufacturing the semiconductor memory device including the floating gate type transistors in the second embodiment in the order of processes.
Figure 17B:
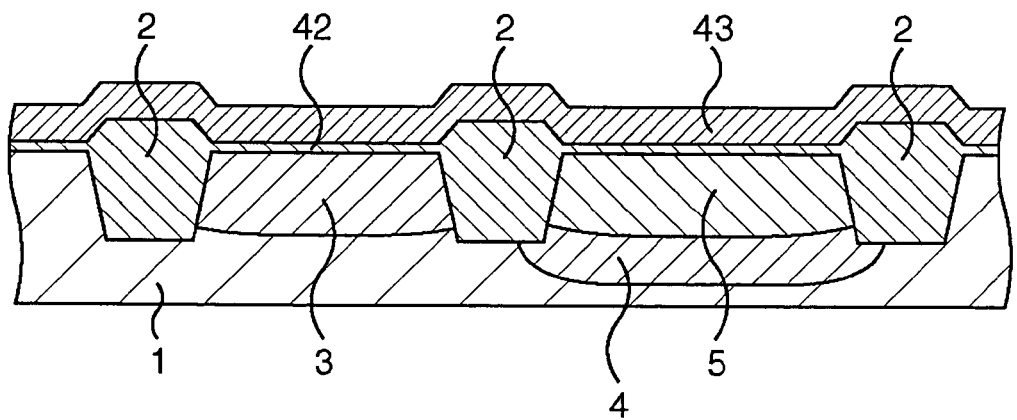

Subsequently, as shown in FIG. 17A and FIG. 17B, amorphous silicon (a-Si) films 43 formed by doping phosphorus (P) are entirely deposited to have a film thickness of approximately 90 nm by a thermal CVD method under a temperature condition of 530° C., using $SiH_4$ and $PH_3$ as raw material gases.

Figure 18A:
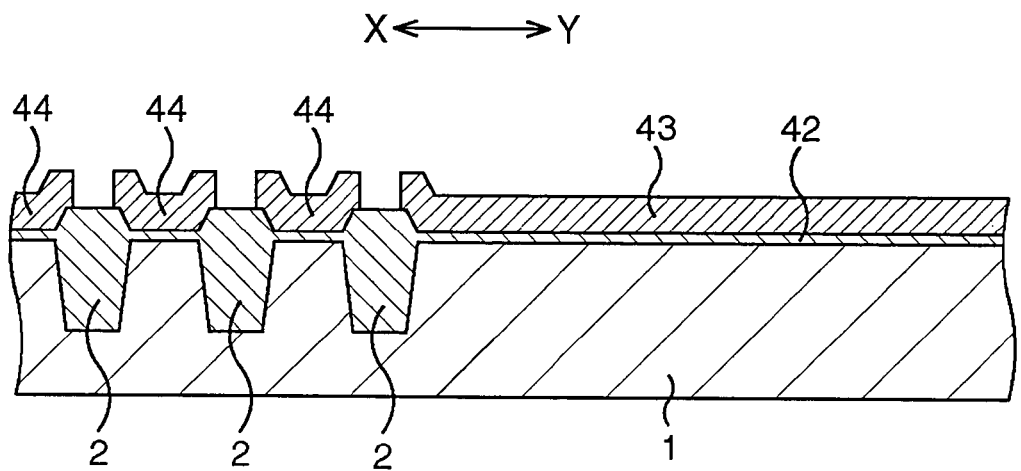
FIG. 18A and FIG. 18B are schematic cross sectional views, subsequent to FIG. 17A and FIG. 17B, showing the method for manufacturing the semiconductor memory device including the floating gate type transistors in the second embodiment in the order of processes.
Figure 18B:
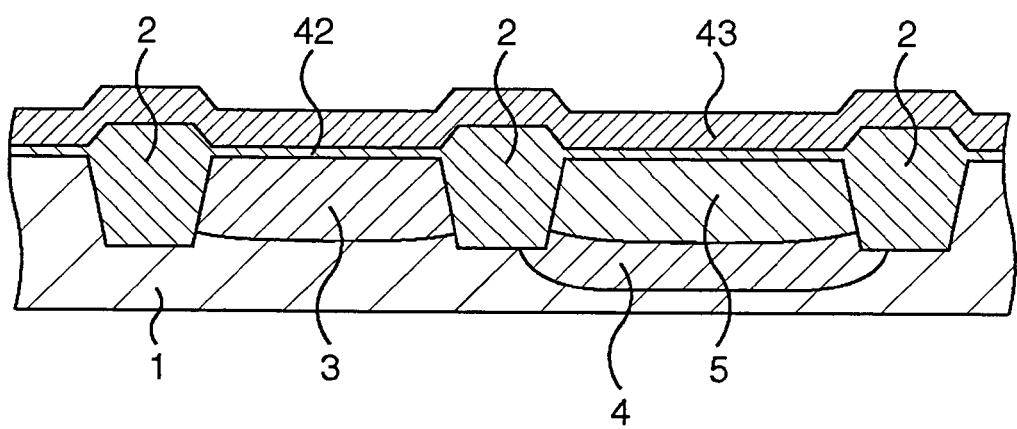

Subsequently, as shown in FIG. 18A and FIG. 18B, the a-Si film 43 is patterned by lithography followed by dry etching to form floating gates 44 which are individually divided perpendicular to later-described word lines. At the same time, in the peripheral circuit region 12, the a-Si film 43 is entirely left.

Subsequently, an ONO film which is a multilayered insulating film is formed as a dielectric film.

Figure 19A:
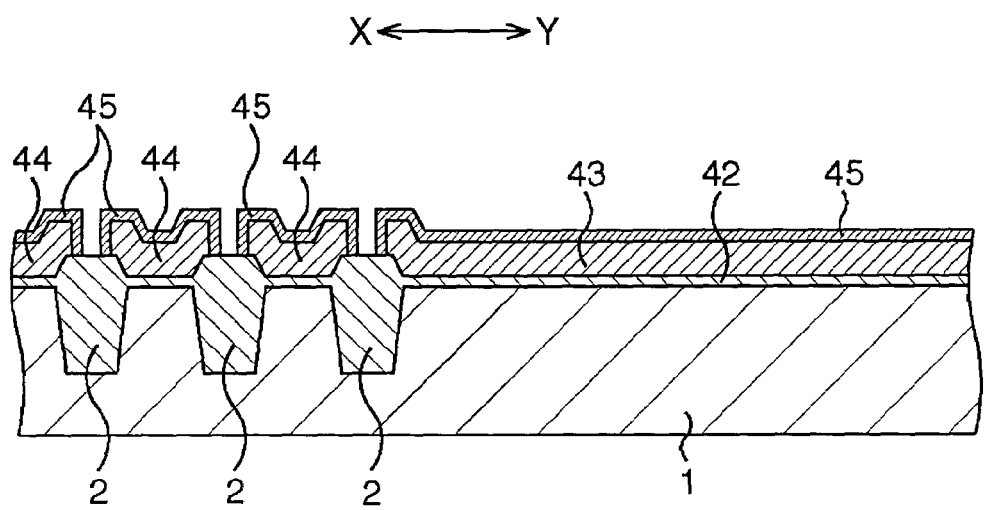
FIG. 19A and FIG. 19B are schematic cross sectional views, subsequent to FIG. 18A and FIG. 18B, showing the method for manufacturing the semiconductor memory device including the floating gate type transistors in the second embodiment in the order of processes.
Figure 19B:
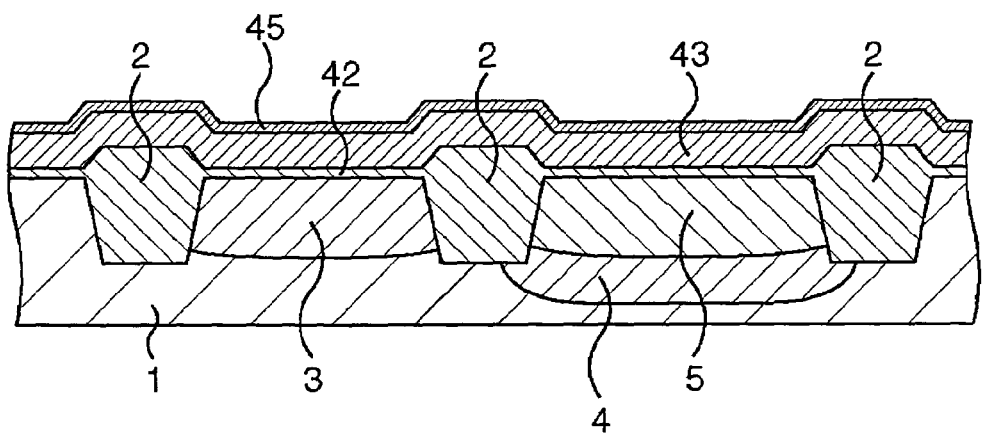
Figure 20:
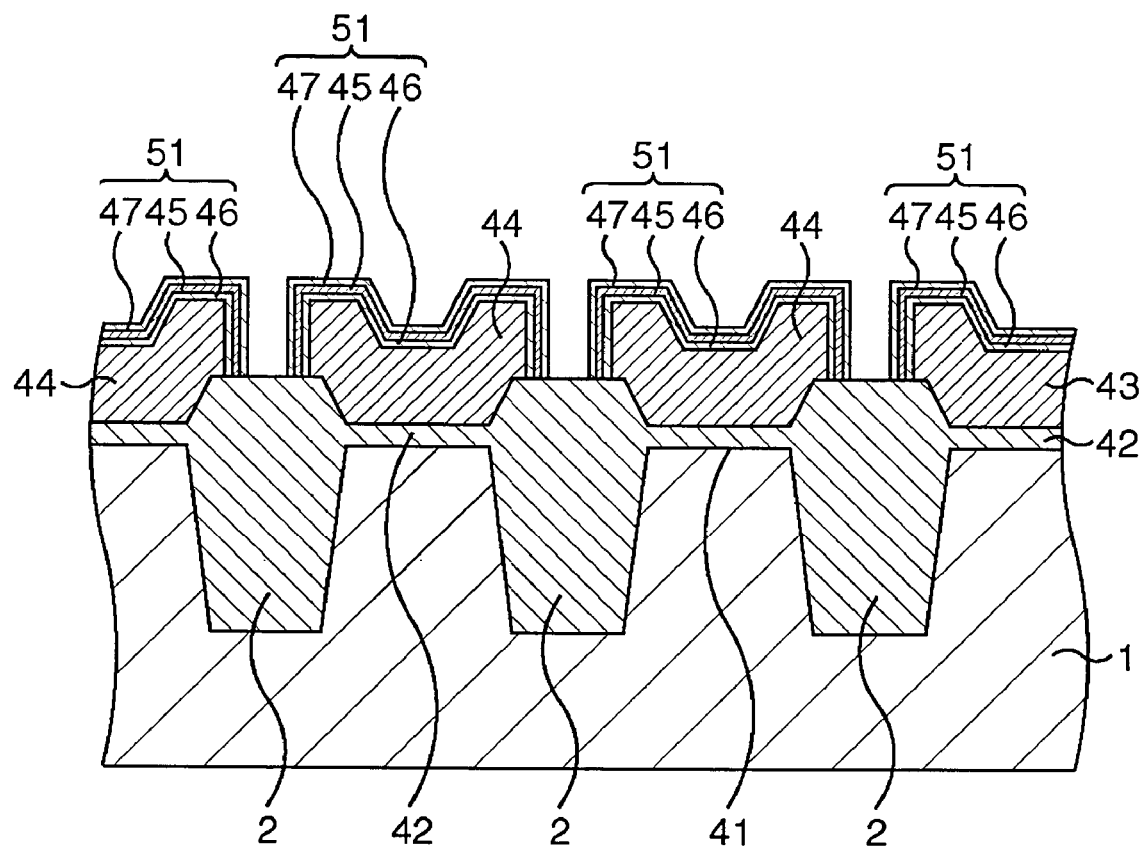
FIG. 20 is a schematic cross sectional views, subsequent to FIG. 19A and FIG. 19B, showing the method for manufacturing the semiconductor memory device including the floating gate type transistors in the second embodiment in the order of processes.

First, as shown in FIG. 19A and FIG. 19B, silicon nitride films 45 are formed by the aforementioned plasma nitriding method.

Specifically, as is the case with the first embodiment, using the plasma processor provided with the radial line slot antenna shown in FIG. 14, and using a source gas containing Ar and $N_2$ but not hydrogen, nitriding processing of surface layers of the a-Si films 43 is conducted by generating a nitrogen radical (N*) by irradiating the source gas with a microwave of 3.5 kW under a temperature condition of 450° C. so as to form the silicon nitride films 45 having a film thickness of approximately 12 nm.

Subsequently, as shown in FIG. 20, a lower silicon oxide film 46 and an upper silicon oxide film 47 are simultaneously formed above and below the silicon nitride film 45 by the aforementioned plasma oxidizing method.

Specifically, using a source gas containing Ar and $O_2$ but not hydrogen, oxidizing processing is conducted by generating an oxygen radical (O*) by irradiating the source gas with a microwave of 3.5 kW under a temperature condition of 450° C. The lower silicon oxide film 46 is formed by replacing an interface of the a-Si film 43 which is approximately 4 nm in thickness facing with the silicon nitride film 45 by an oxide film. Simultaneously, the upper silicon oxide film 47 is formed by replacing an upper layer of approximately 5 nm in thickness of the silicon nitride film 45 by an oxide film. At this time, in the core region 11, an ONO film 51 composed of the lower silicon oxide film 46 having a film thickness of approximately 4 nm on the floating gate 44 whose film thickness is reduced to approximately 81 nm by the aforementioned plasma nitriding and plasma oxidization, the silicon nitride film 45 whose film thickness is reduced to approximately 6 nm, and the upper silicon oxide film 47 having a film thickness of approximately 4 nm is formed. It should be noted that the three layers 45, 46, and 47 are shown as a single-layered ONO film 51 for simplification from the following FIG. 21A to FIG. 26B as a matter of convenience.

Figure 21A:
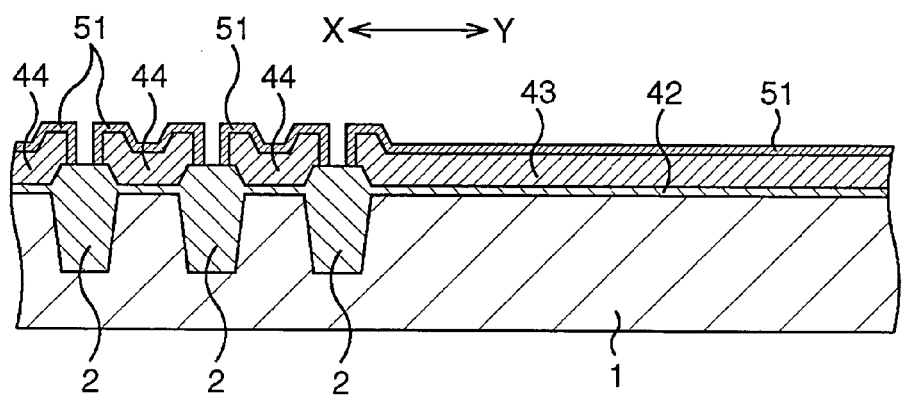
FIG. 21A and FIG. 21B are schematic cross sectional views, subsequent to FIG. 20, showing the method for manufacturing the semiconductor memory device including the floating gate type transistors in the second embodiment in the order of processes.
Figure 21B:
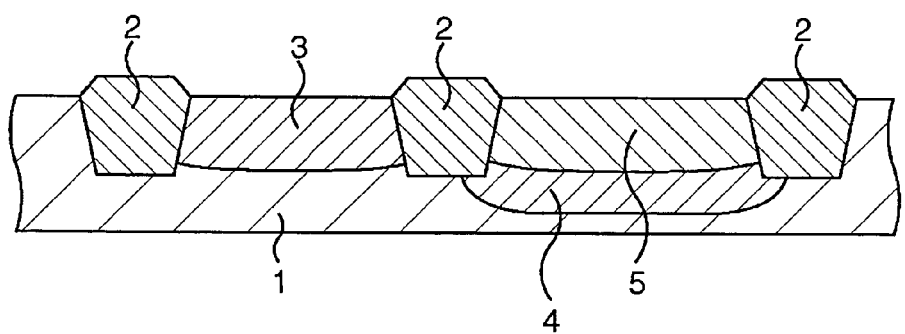

Subsequently, as shown in FIG. 21A and FIG. 21B, the ONO film 51 and the a-Si film 43 in the peripheral circuit region 12 are removed by dry etching. Furthermore, the silicon surface of the element active regions in the peripheral circuit region 12 is exposed by HF treatment.

Figure 22A:
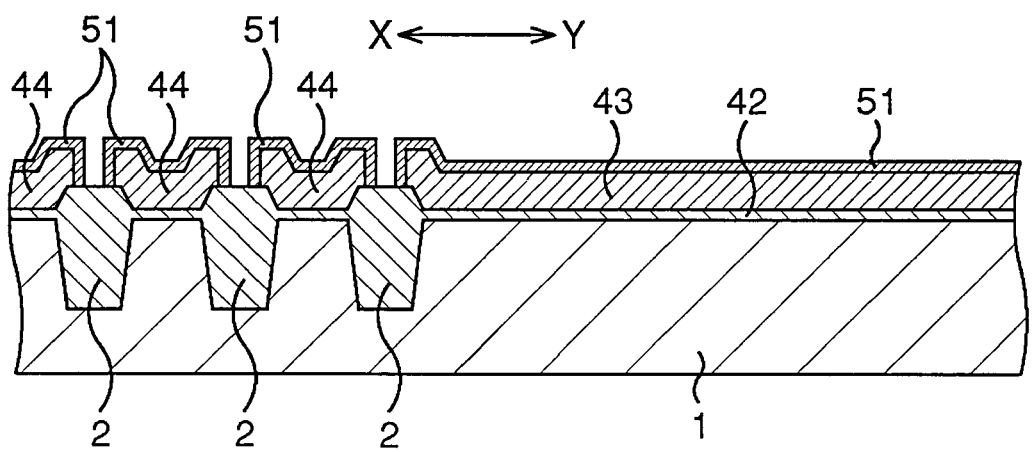
FIG. 22A and FIG. 22B are schematic cross sectional views, subsequent to FIG. 21A and FIG. 21B, showing the method for manufacturing the semiconductor memory device including the floating gate type transistors in the second embodiment in the order of processes.
Figure 22B:
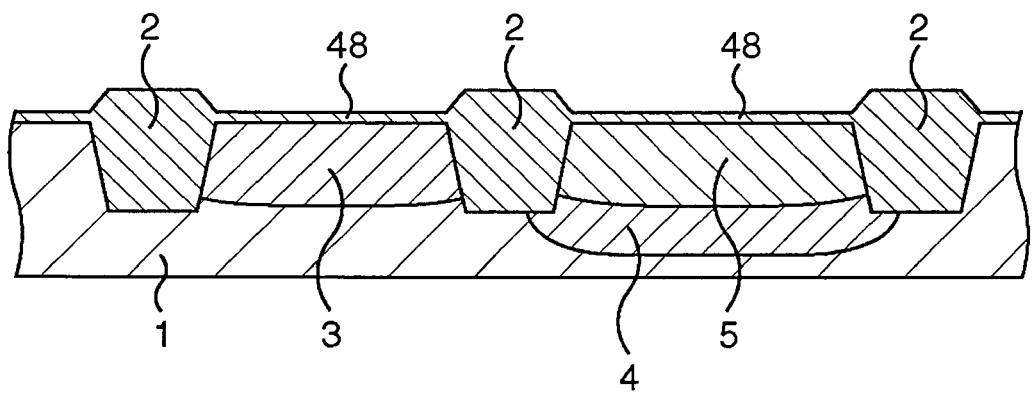

Subsequently, as shown in FIG. 22A and FIG. 22B, the silicon surface of the element active regions in the peripheral circuit region 12 is thermally oxidized to form silicon oxide films 48 having a film thickness of approximately 8 nm. At this time, oxidizing power by thermal oxidation method is not so strong that oxidation of the ONO film 51 in the core region 11 can be ignored.

Figure 23A:
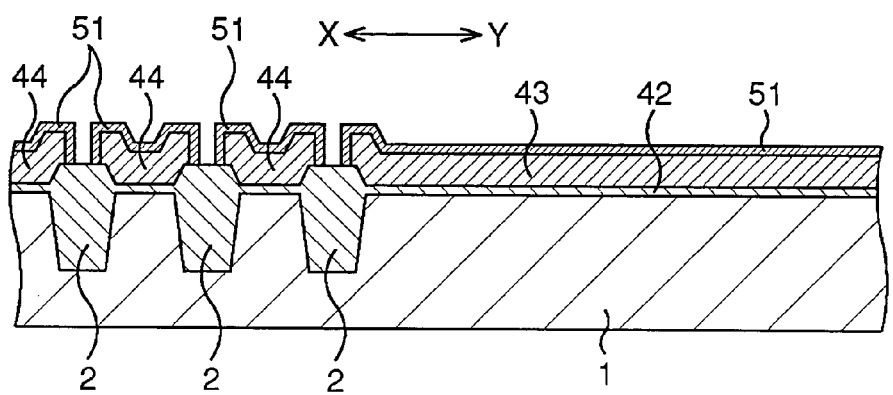
FIG. 23A and FIG. 23B are schematic cross sectional views, subsequent to FIG. 22A and FIG. 22B, showing the method for manufacturing the semiconductor memory device including the floating gate type transistors in the second embodiment in the order of processes.
Figure 23B:
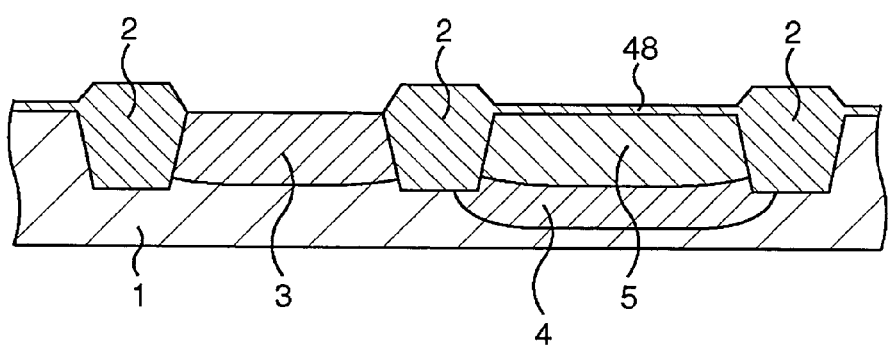

Subsequently, as shown in FIG. 23A and FIG. 23B, a part for forming a thin gate insulation film in the peripheral circuit region 12, in this example, the silicon oxide film 48 in the n-type region is removed by HF treatment.

Figure 24A:
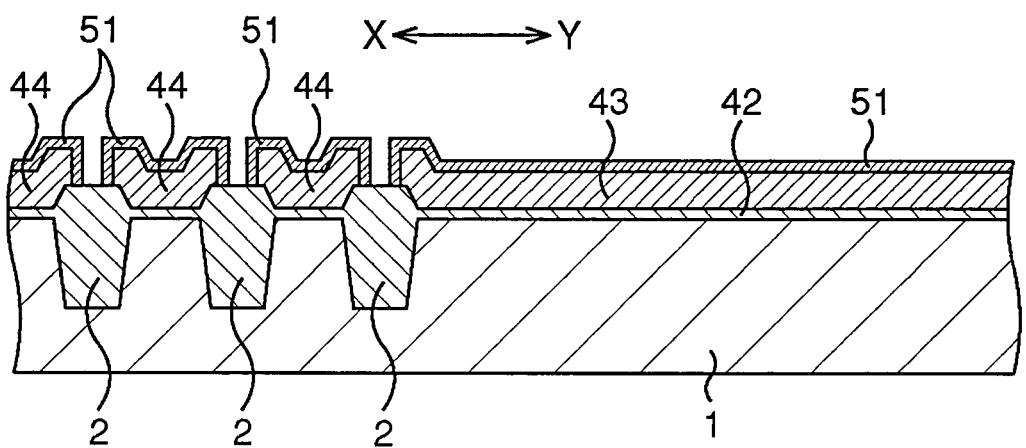
FIG. 24A and FIG. 24B are schematic cross sectional views, subsequent to FIG. 23A and FIG. 23B, showing the method for manufacturing the semiconductor memory device including the floating gate type transistors in the second embodiment in the order of processes.
Figure 24B:
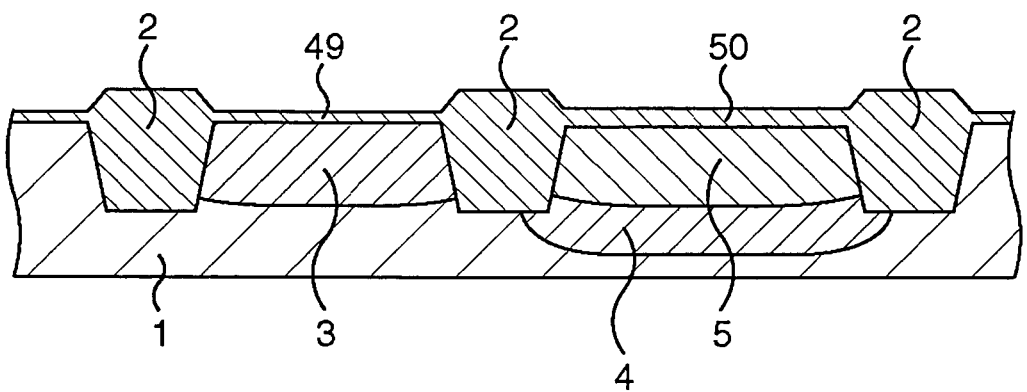

Subsequently, as shown in FIG. 24A and FIG. 24B, thermal oxidization is conducted so as to form a silicon oxide film having a film thickness of approximately 7 nm on the silicon surfaces in the n-type and the p-type region in the peripheral circuit region 12. A thin gate insulation film 49 having a film thickness of approximately 10 nm is formed in the n-type region. Furthermore, a gate insulation film 50 having a film thickness of 16 nm is formed in the p-type region as a result of thermal oxidation having a film thickness of approximately 10 nm after thermal oxidation having a film thickness of aforementioned 8 nm.

Figure 25A:
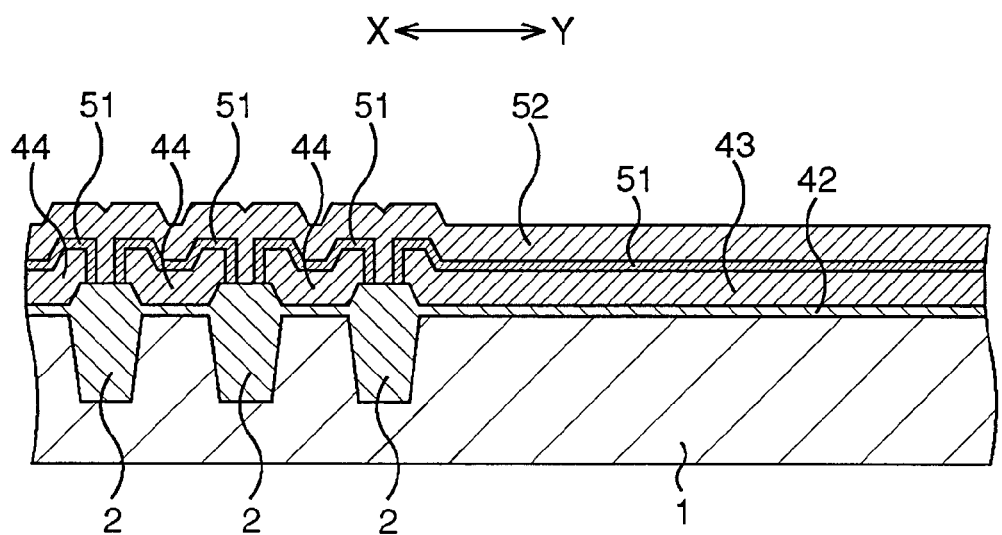
FIG. 25A and FIG. 25B are schematic cross sectional views, subsequent to FIG. 24A and FIG. 24B, showing the method for manufacturing the semiconductor memory device including the floating gate type transistors in the second embodiment in the order of processes.
Figure 25B:
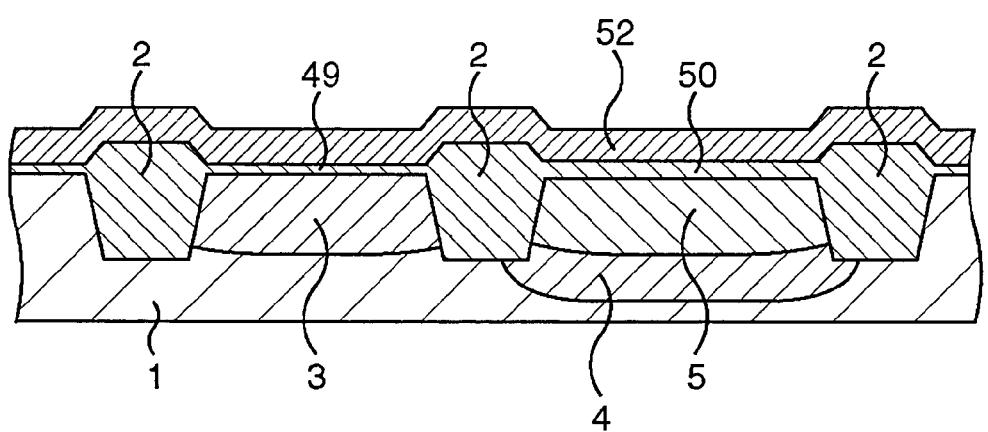
Figure 26A:
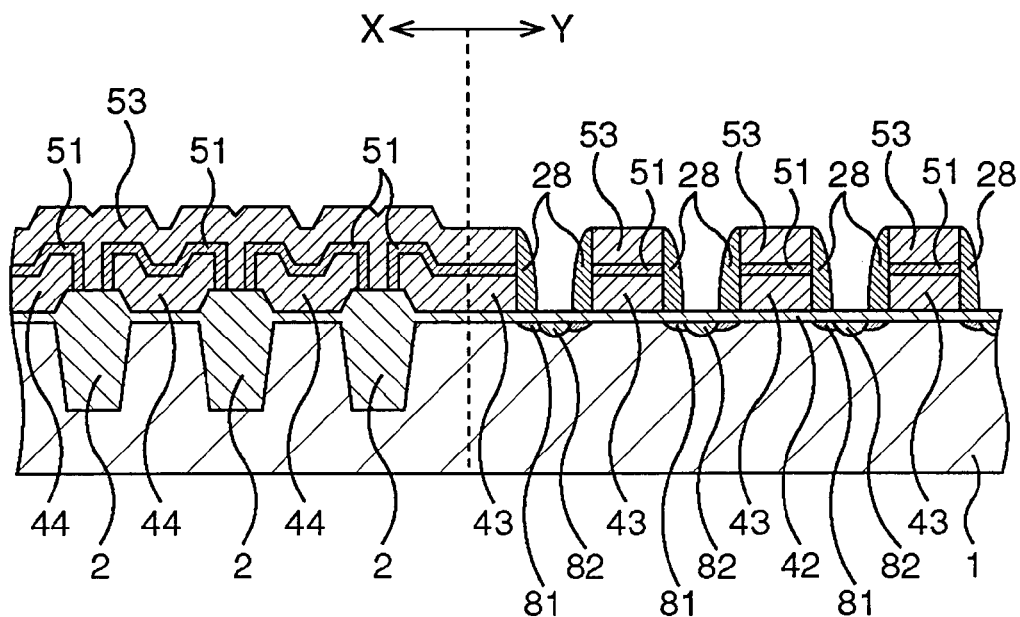
FIG. 26A and FIG. 26B are schematic cross sectional views, subsequent to FIG. 25A and FIG. 25B, showing the method for manufacturing the semiconductor memory device including the floating gate type transistors in the second embodiment in the order of processes.
Figure 26B:
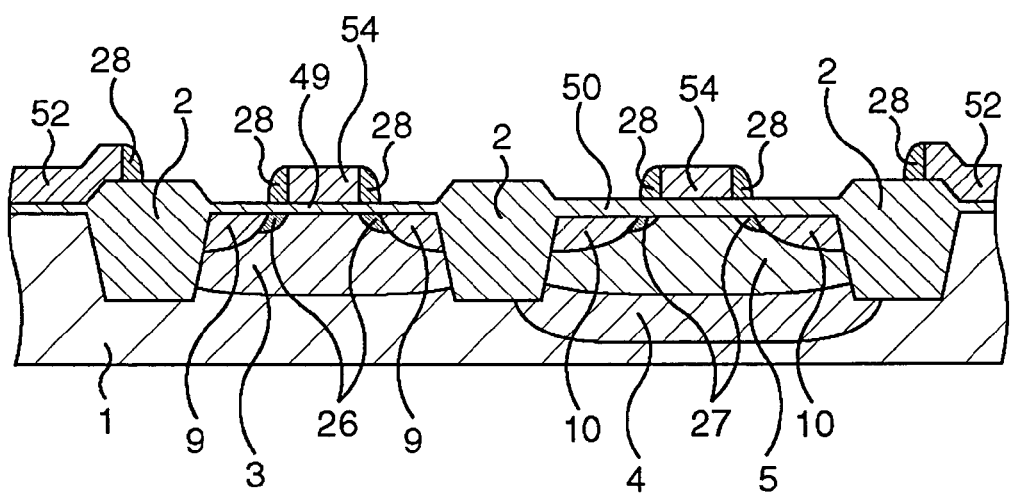

Subsequently, as shown in FIG. 25A and FIG. 25B, after a-Si films 52 are deposited on entire surfaces by a CVD method, as shown in FIG. 26A and FIG. 26B, the a-Si films 52 (and the a-Si film 43 in the core region 11) are patterned by lithography followed by dry etching. In the core region 11, control gates 53 functioning as word lines for conducting capacity coupling with the floating gates 44 through the ONO film 51 as the dielectric film are formed. In the peripheral circuit region 12, gate electrodes 54 as components of the CMOS transistors are formed. At this time, by dry etching of the a-Si film 52, protruding parts of the control gates 53 from the floating gates 44 are removed simultaneously when the control gates 53 are formed.

Subsequently, extension regions 81 are formed only in the core region 11.

Specifically, n-type impurities are ion-implanted into the surface of the semiconductor substrate 1 on both sides of the control gates 53 to form the extension regions 81.

Subsequently, extension regions 26 and 27 are formed only in the peripheral circuit region 12.

Specifically, n-type impurities are ion-implanted into the surface of the semiconductor substrate 1 on both sides of the gate electrode 54 in the n-type region to form the extension regions 26. Meanwhile, in the p-type region, p-type impurities are ion-implanted into the surface of the semiconductor substrate 1 on both sides of the gate electrode 54 to form the extension regions 27.

Next, after a silicon oxide film is deposited over an entire surface by a CVD method, the entire surface of the silicon oxide film is antisotropically etched (etch back) so as to leave only the silicon oxide films on both sides of the respective gate electrodes 54, thereby forming sidewalls 28.

Then, in the core region 11, n-type impurities are ion-implanted into the surface of the semiconductor substrate 1 on both sides of the control gates 53 and the sidewalls 28 to form sources/drains 82 which partly overlap the extension regions 81.

Then, in the peripheral circuit region 12, in the n-type region, n-type impurities are ion-implanted into the surface of the semiconductor substrate 1 on both sides of the gate electrodes 54 and the sidewalls 28 to form deep sources/drains 9 which partly overlap the extension regions 26. Meanwhile, in the p-type region, p-type impurities are ion-implanted into the surface of the semiconductor substrate 1 on both sides of the gate electrode 54 and the sidewalls 28 to form deep sources/drains 10 which partly overlap the extension regions 27. At this time, surfaces of the sources/drains 9 and 10 may be exposed so as to form siliside layers on the sources/drains 9 and 10, and on the gate electrodes 54 in the peripheral circuit region 12 by conducting salicide process.

Thereafter, a several-layered interlayer dielectric covering the entire surface, contact holes, via holes, various kinds of wiring layers, and so on are formed, and a protective insulation film (none of them are shown) is formed on a top layer so that, on the semiconductor substrate 1, many semiconductor memory devices provided with a peripheral circuit including floating gate type memory cells and the CMOS transistors are formed. Then, an individual semiconductor memory device is manufactured by separating and packaging the above-mentioned devices.

As explained above, according to the present embodiment, the ONO film 51 functioning as the dielectric film is formed in low temperature and of high quality, and, the silicon oxide films above and below the silicon nitride film are simultaneously formed. This decreases the number of processes and makes it possible to realize a floating gate type semiconductor memory device of high reliability and low cost.

-Third Embodiment-

In this embodiment, a semiconductor memory device having an embedded bit line type SONOS structure will be disclosed. A structure of the semiconductor memory device is explained with a method for manufacturing thereof as a matter of convenience.

This semiconductor memory device is so structured that SONOS transistors in a memory cell region are of a planer type and that CMOS transistors are formed in a peripheral circuit region.

FIG. 27A to FIG. 35B are schematic cross sectional views showing a method for manufacturing the semiconductor memory device including embedded bit line type SONOS transistors in this embodiment in the order of processes. It should be noted that, for convenience, the same reference numerals are given to the components or the like explained in the first embodiment. Here, each A of the drawings shows a memory cell region (a core region), and each B thereof shows a peripheral circuit region. The left side of the A thereof corresponds to a cross section (an X section) taken along the parallel line to a gate electrode (a word line), and the right side corresponds to a cross section (a Y section) taken along the perpendicular line to the gate electrode.

Figure 27A:
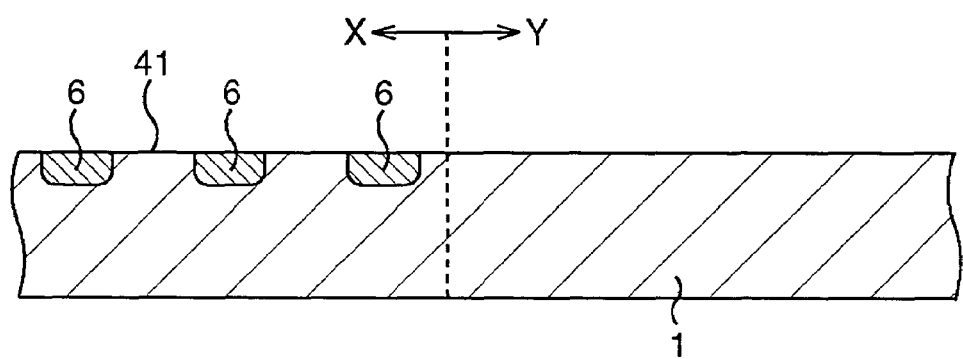
FIG. 27A and FIG. 27B are schematic cross sectional views showing a method for manufacturing a semiconductor memory device including embedded bit line type SONOS transistors in a third embodiment in the order of processes.
Figure 27B:
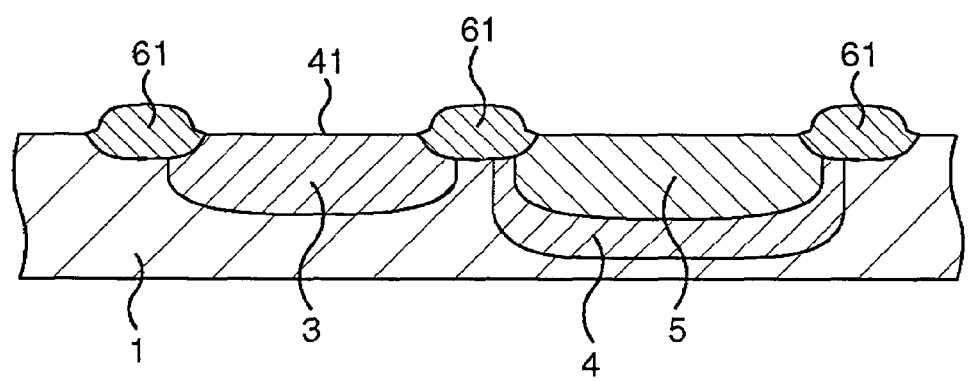

First, as shown in FIG. 27A and FIG. 27B, wells 3, 4, and 5 are formed in a peripheral circuit region 12.

Specifically, in an n-type region, n-type impurities such as phosphorus (P), arsenic (As), or the like are ion-implanted into only an n-type region of the peripheral circuit region 12, and the impurities are thermally diffused by annealing treatment to form the n-well 3 in the n-type region. On the other hand, in a p-type region, the n-type impurities such as phosphorus (P), arsenic (As), or the like are deeply ion-implanted into only a p-type region of the peripheral circuit region 12, and a p-type impurity such as boron (B) is less shallowly ion-implanted than the n-type impurities. Then, the impurities are thermally diffused by annealing treatment to form the deep n-well 4 and the p-well 5 in the n-well 4 so as to form a triple-well structure in the p-type region.

Subsequently, element isolation structures are formed in a peripheral circuit region 12 to demarcate element active regions.

Here, by a so-called LOCOS method, field oxide films 61 are formed in element isolation regions in the peripheral circuit region 12 of a p-type silicon semiconductor substrate 1 so as to demarcate the element active regions. Incidentally, since a planar-type memory is disclosed in this embodiment, element isolation structures are not formed in the core region.

Subsequently, a resist mask (not shown) covering only the p-type region of the peripheral circuit region 12 is formed. Furthermore, using this as a mask, ion-implantation of boron (B) for threshold value adjustment is conducted (shown as a reference numeral 41). Incidentally, this ion-implantation is not limited to the p-type region, and is applicable to the n-type region.

Subsequently, bit-line diffusion layers 6 are formed in a core region 11 of the semiconductor substrate 1.

Specifically, resist masks (not shown) in a bit-line shape are formed by lithography, and using them as masks, an n-type impurity, arsenic (As) in this example, is ion-implanted. Here, it is ion-implanted with a dose amount of $2.0 \times 10^{14}$ (/cm$^2$) or more in order to lower bit-line resistance. Through these processes, the bit-line diffusion layers 6 also serving as sources/drains are formed.

Subsequently, after the resist masks are removed by ashing treatment or the like, and after silicon surfaces of the respective element active regions in the core region 11 and the peripheral circuit region 12 are exposed by HF treatment, an ONO film as a multilayered insulating film is formed.

Figure 28A:
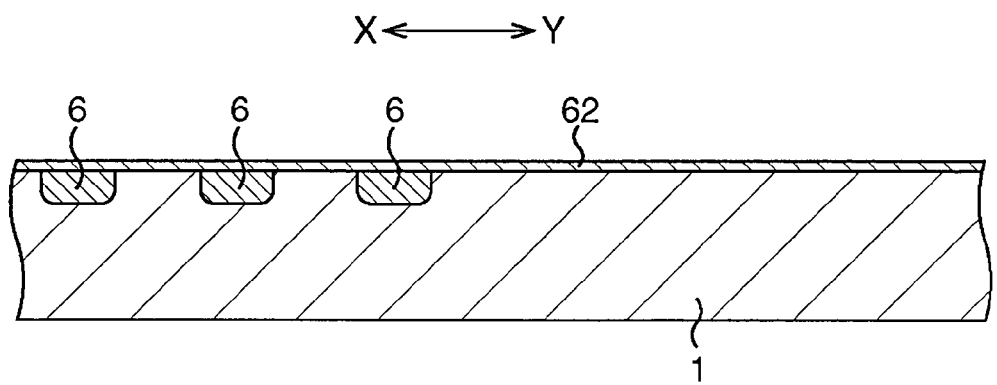
FIG. 28A and FIG. 28B are schematic cross sectional views, subsequent to FIG. 27A and FIG. 27B, showing the method for manufacturing the semiconductor memory device including the embedded bit line type SONOS transistors in the third embodiment in the order of processes.
Figure 28B:
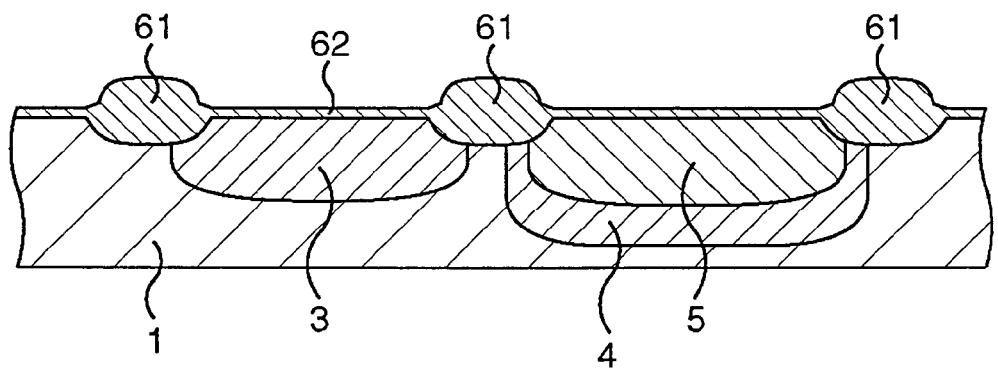

Specifically, as shown in FIG. 28A and FIG. 28B, lower silicon oxide films 62 are formed on silicon surfaces of the element active regions by the aforementioned plasma oxidizing method.

Specifically, using the plasma processor provided with the radial line slot antenna shown in FIG. 14, and using a source gas containing Ar and O$_2$ but not hydrogen, oxidizing processing is conducted by generating an oxygen radical (O*) by irradiating the source gas with a microwave of 3.5 kW under a temperature condition of 450° C. so as to form the lower silicon oxide films 62. When the lower silicon oxide films 62 are formed, by using the plasma oxidization instead of a thermal oxidization, dense films are formed in low temperature, thereby controlling impurity diffusion of the bit-line diffusion layers 6.

Figure 29A:
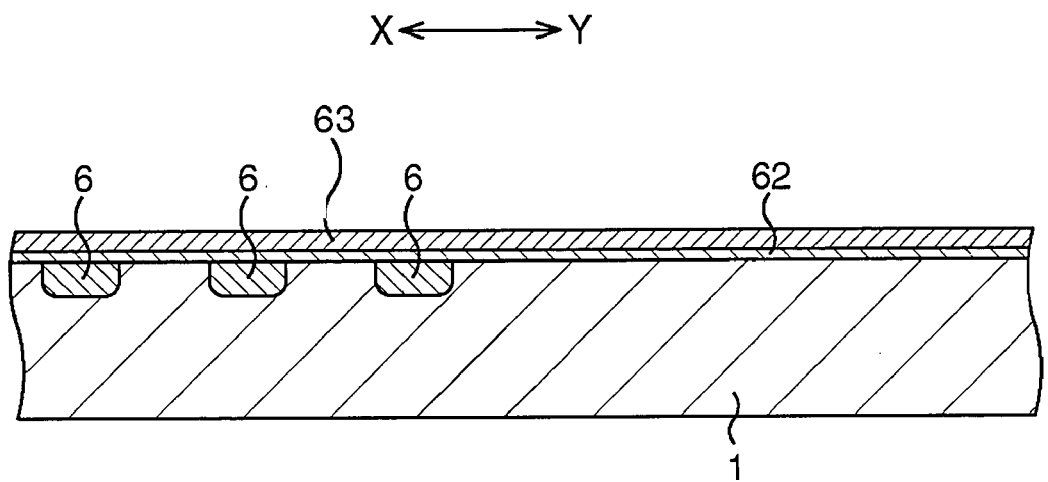
FIG. 29A and FIG. 29B are schematic cross sectional views, subsequent to FIG. 28A and FIG. 28B, showing the method for manufacturing the semiconductor memory device including the embedded bit line type SONOS transistors in the third embodiment in the order of processes.
Figure 29B:
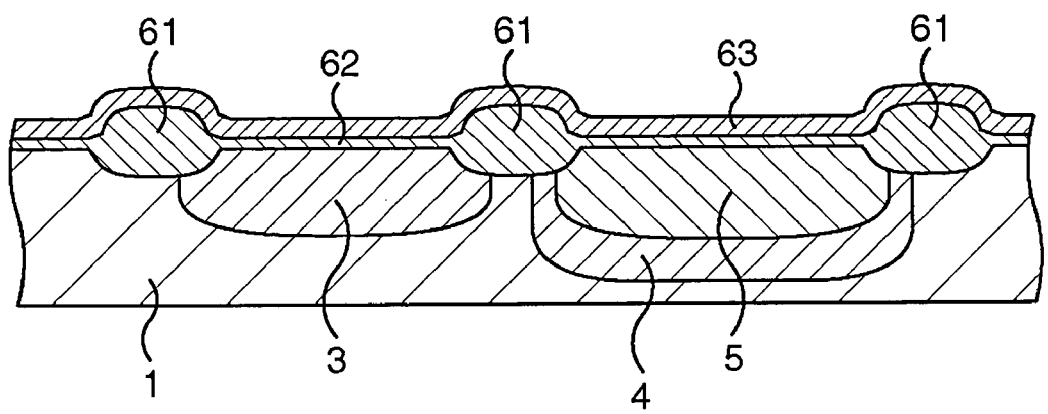

Subsequently, as shown in FIG. 29A and FIG. 29B, silicon nitride films 63 are formed on the lower silicon oxide films 62 by a thermal CVD method.

Specifically, the silicon nitride films 63 are deposited to have a film thickness of approximately 15 nm by the thermal CVD method under a temperature condition of 730° C., using $SiH_2Cl_2$ and $NH_3$ as raw material gases. Here, by conducting thermal CVD instead of plasma nitriding, the silicon nitride films functioning as charge-storage films with many traps suitable for SONOS type memory cells can be formed.

Figure 30A:
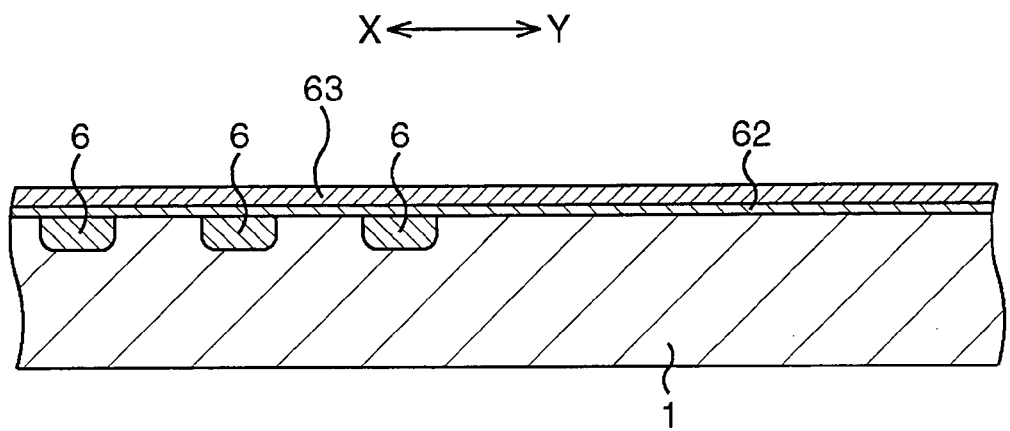
FIG. 30A and FIG. 30B are schematic cross sectional views, subsequent to FIG. 29A and FIG. 29B, showing the method for manufacturing the semiconductor memory device including the embedded bit line type SONOS transistors in the third embodiment in the order of processes.
Figure 30B:
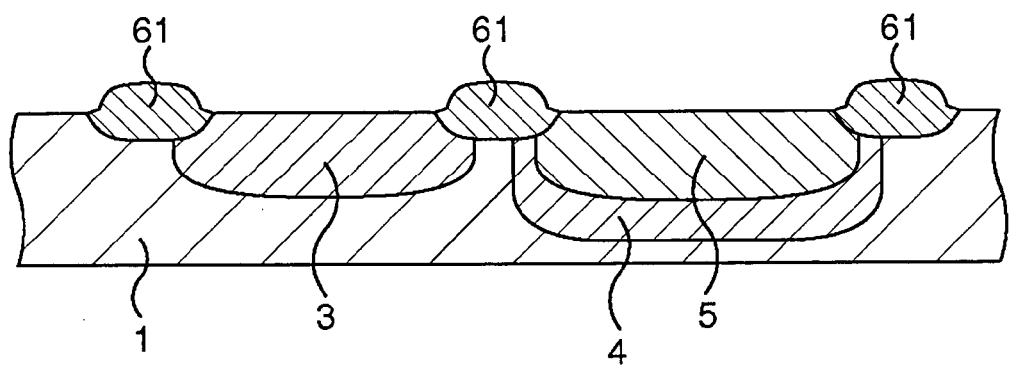

Subsequently, as shown in FIG. 30A and FIG. 30B, only the core region 11 is covered with a resist mask (not shown), and using it as a mask, the silicon nitride film 63 formed in the peripheral circuit region 12 is removed by dry etching. Subsequently, the lower silicon oxide film 62 formed in the peripheral circuit region 12 is removed by HF treatment so as to expose the surface of the semiconductor substrate 1 in the peripheral circuit region 12.

Subsequently, after the resist mask is removed by ashing treatment or the like, an upper silicon oxide film 64 in the core region 11, and gate insulation films 24 and 25 in the peripheral circuit region 12 are formed by plasma oxidizing method.

Figure 31A:
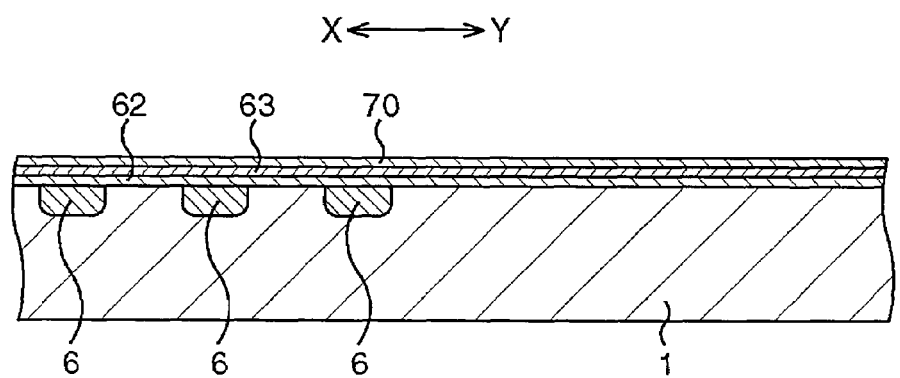
FIG. 31A and FIG. 31B are schematic cross sectional views, subsequent to FIG. 30A and FIG. 30B, showing the method for manufacturing the semiconductor memory device including the embedded bit line type SONOS transistors in the third embodiment in the order of processes.
Figure 31B:
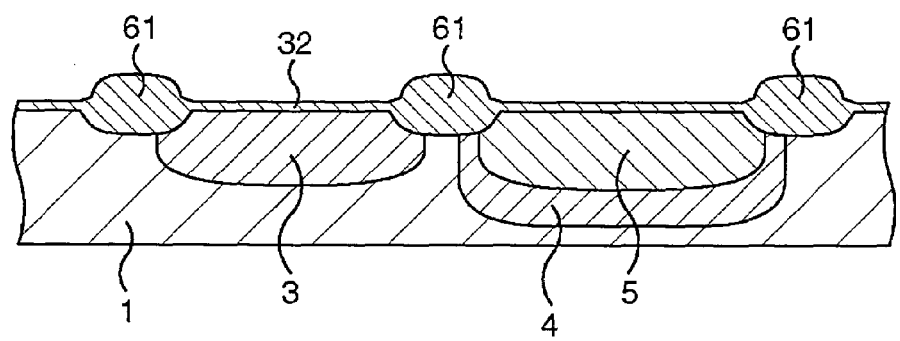

Specifically, as shown in FIG. 31A and FIG. 31B, using a source gas containing Ar and $O_2$ but not hydrogen, oxidizing processing is conducted by generating an oxygen radical (O*) by irradiating the source gas with a microwave of 3.5 kW under a temperature condition of 450° C. A silicon oxide film 70 is formed by oxidizing a surface layer of the silicon nitride film 63 in the core region 11. Simultaneously, a silicon oxide film 32 having a film thickness of approximately 8 nm is formed in the peripheral circuit region 12.

Figure 32A:
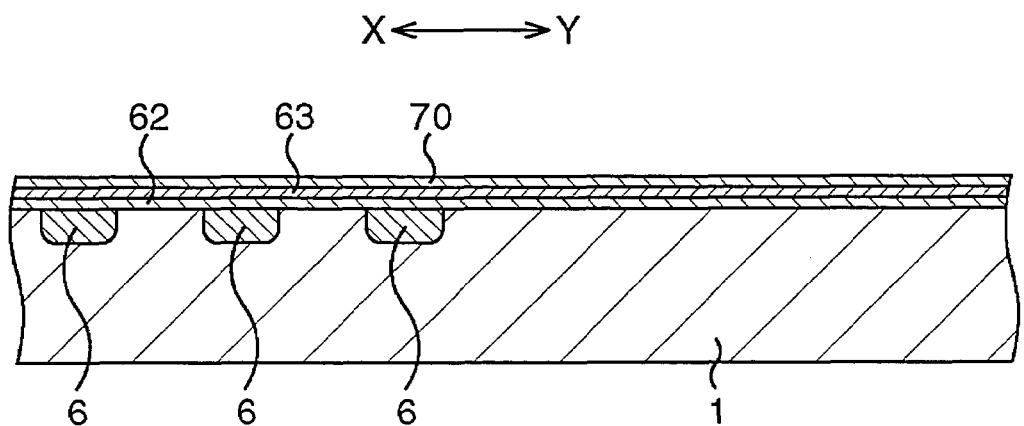
FIG. 32A and FIG. 32B are schematic cross sectional views, subsequent to FIG. 31A and FIG. 31B, showing the method for manufacturing the semiconductor memory device including the embedded bit line type SONOS transistors in the third embodiment in the order of processes.
Figure 32B:
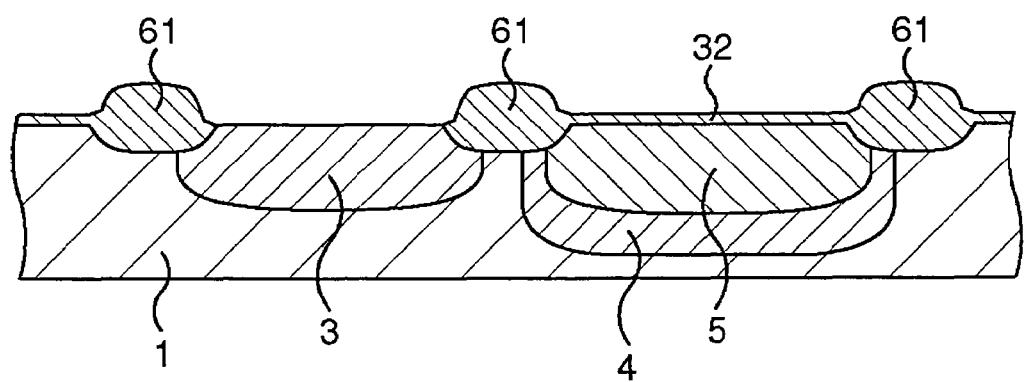

Subsequently, as shown in FIG. 32A and FIG. 32B, a part for forming a thin gate insulation film in the peripheral circuit region 12, that is, a resist mask (not shown) for exposing only the n-type region is formed. HF treatment is conducted using it as a mask, thereby removing the silicon oxide film 32 in the n-type region.

Figure 33A:
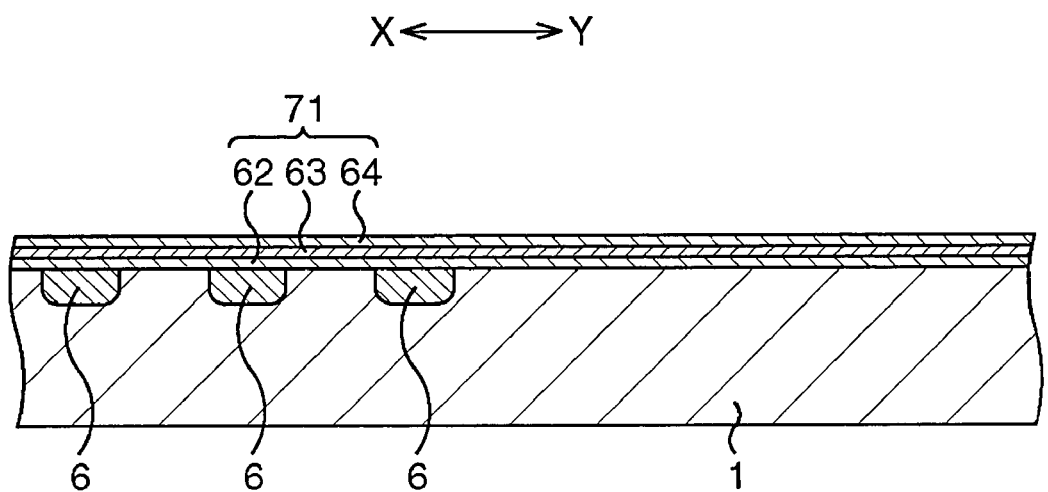
FIG. 33A and FIG. 33B are schematic cross sectional views, subsequent to FIG. 32A and FIG. 32B, showing the method for manufacturing the semiconductor memory device including the embedded bit line type SONOS transistors in the third embodiment in the order of processes.
Figure 33B:
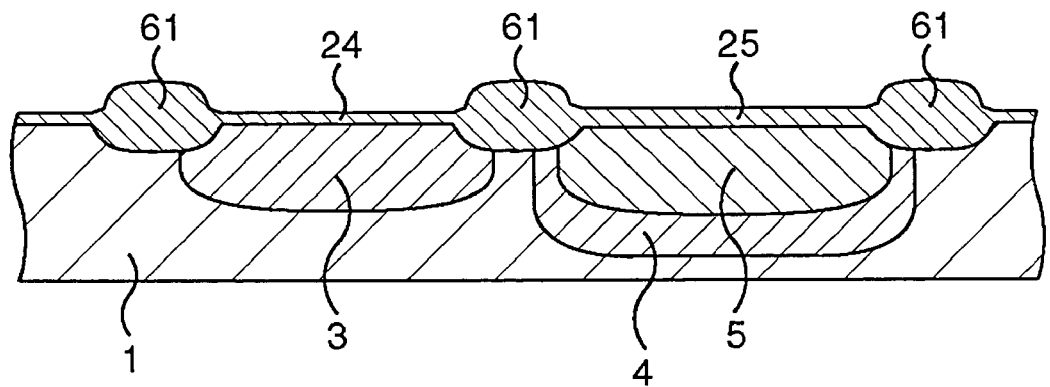

Subsequently, after the resist mask is removed by ashing treatment or the like, as shown in FIG. 33A and FIG. 33B, oxidizing processing is conducted by the aforementioned plasma oxidizing method so as to form a silicon oxide film having a film thickness of approximately 7 nm on a surface of the exposed semiconductor substrate 1. At this time, in the core region 11, the surface layer of the silicon nitride film 63 is further oxidized and replaced by a silicon oxide film, and as a result, an upper silicon oxide film 64 having a film thickness of approximately 10 nm is formed. Simultaneously, in the peripheral circuit region 12, a thin gate insulation film 24 having a film thickness of approximately 7 nm is formed in the n-type region. Furthermore, a gate insulation film 25 having a film thickness of approximately 13 nm is formed as a result of plasma oxidization having a film thickness of approximately 7 nm after plasma oxidization having a film thickness of aforementioned 8 nm (the silicon oxide film 32) in the p-type region.

In the core region 11, an ONO film 71 composed of the lower silicon oxide film 62 having a film thickness of approximately 8 nm formed by plasma oxidization, the silicon nitride film 63 having a film thickness of approximately 10 nm formed by thermal CVD as a charge-storage film whose surface layer is reduced by plasma oxidization twice, and the upper silicon oxide film 64 formed by plasma oxidization is formed. On the other hand, in the peripheral circuit region 12, a thin gate insulation film 24 having a film thickness of approximately 8 nm in the n-type region and a gate insulation film 25 having a film thickness of approximately 13 nm in the p-type region are respectively formed.

Figure 34A:
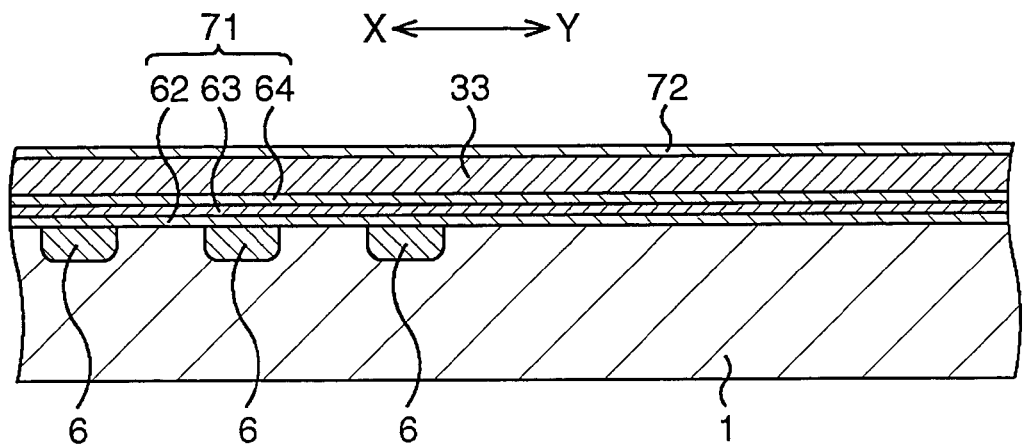
FIG. 34A and FIG. 34B are schematic cross sectional views, subsequent to FIG. 33A and FIG. 33B, showing the method for manufacturing the semiconductor memory device including the embedded bit line type SONOS transistors in the third embodiment in the order of processes.
Figure 34B:
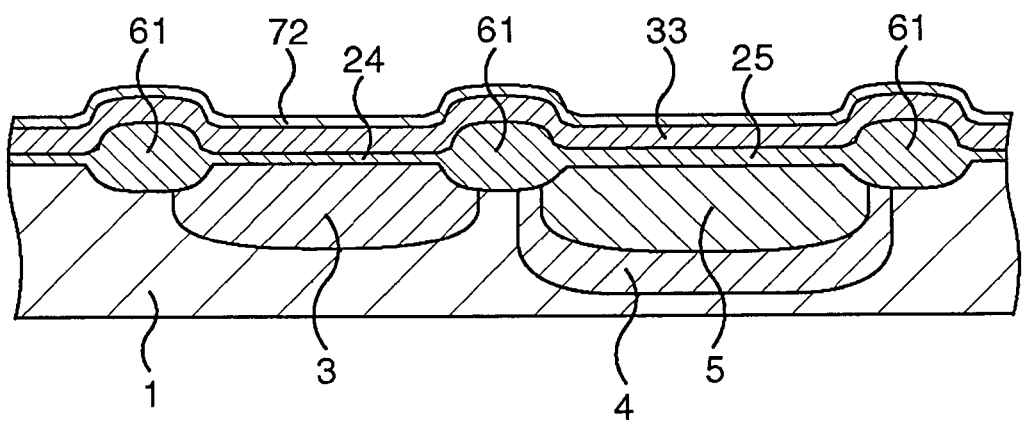

Subsequently, as shown in FIG. 34A and FIG. 34B, on entire surfaces of the core region 11 and the peripheral circuit region 12, polycrystalline silicon films 33 are firstly formed and tungsten silicide films 72 are secondly formed by a CVD method.

Figure 35A:
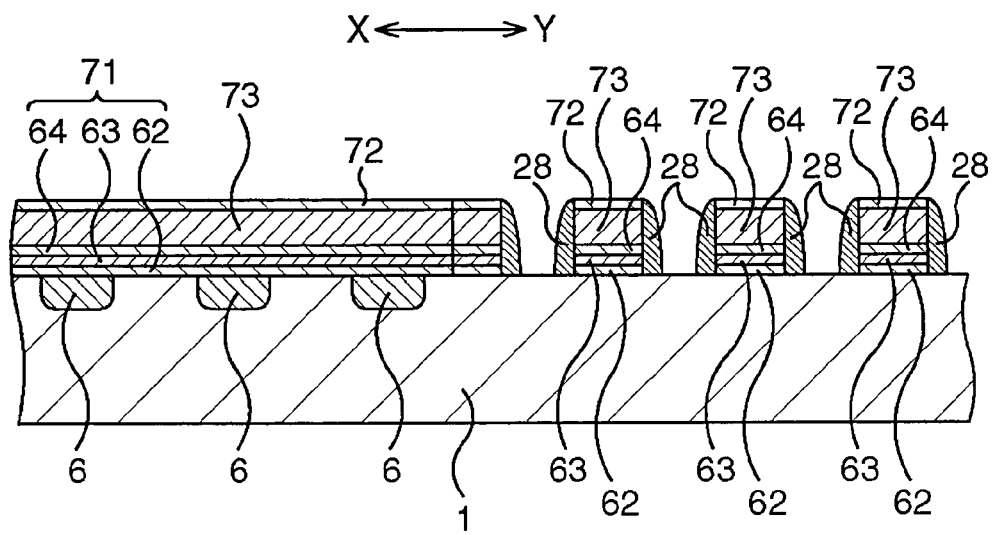
FIG. 35A and FIG. 35B are schematic cross sectional views, subsequent to FIG. 34A and FIG. 34B, showing the method for manufacturing the semiconductor memory device including the embedded bit line type SONOS transistors in the third embodiment in the order of processes.
Figure 35B:
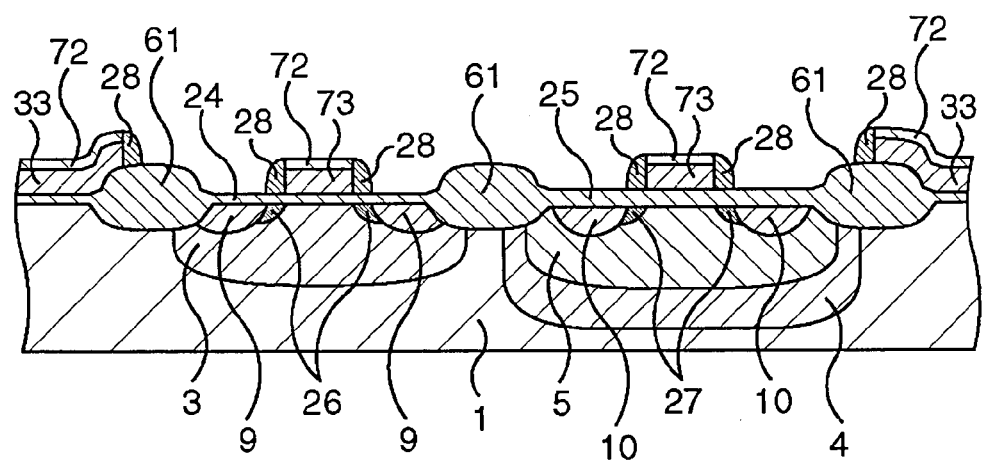
Figure 36:
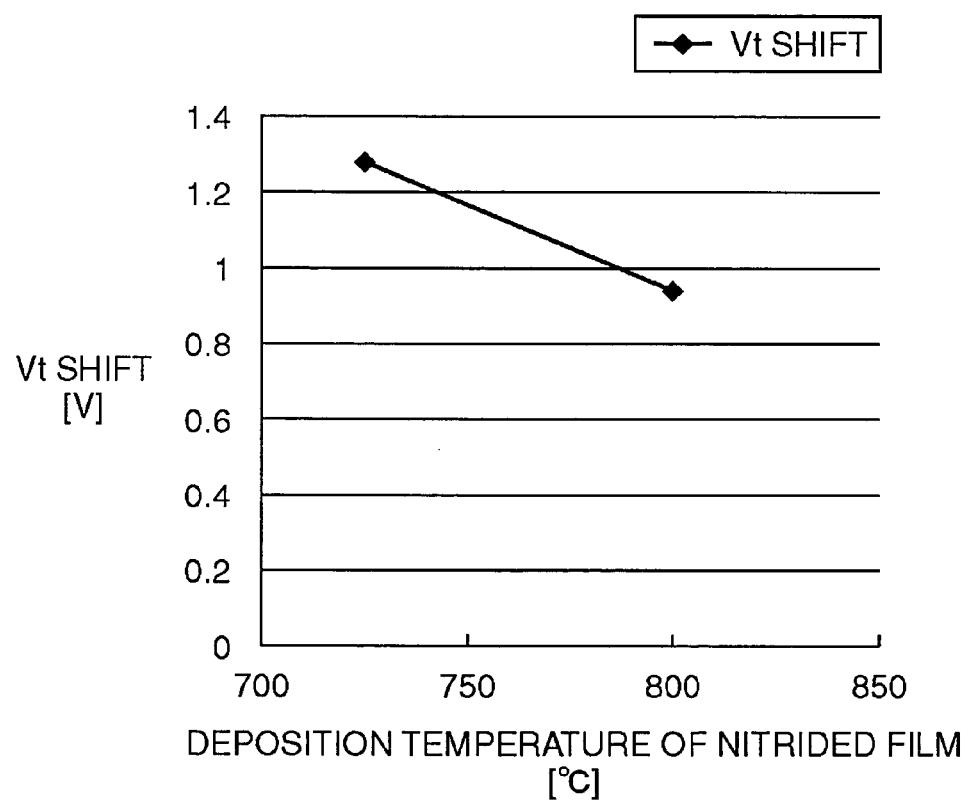
FIG. 36 is a characteristic chart showing a result of a study in a relationship between a deposition temperature of a silicon nitride film and a threshold value (Vt) shift caused by leaving the silicon nitride film in a high temperature.

Subsequently, as shown in FIG. 35A and FIG. 35B, the polycrystalline silicon films 33 and the tungsten silicide film 72 are patterned by lithography followed by dry etching to form gate electrodes 73 in the core region 11, and the n-type region and the p-type region of the peripheral circuit region 12, respectively. At this time, these gate electrodes 73 in the core region 11 are formed to cross the bit line diffusion layers 6 substantially perpendicularly.

Subsequently, sources/drains 9 and 10 are formed only in the peripheral circuit region 12.

Specifically, n-type impurities are ion-implanted into the surface of the semiconductor substrate 1 on both sides of the gate electrode 73 in the n-type region to form extension regions 26. Meanwhile, in the p-type region, p-type impurities are ion-implanted into the surface of the semiconductor substrate 1 on both sides of the gate electrode 73 to form extension regions 27.

Next, after a silicon oxide film is deposited over the entire surface by a CVD method, the entire surface of the silicon oxide film is antisotropically etched (etch back) so as to leave only the silicon oxide films on both sides of the respective gate electrodes 73, thereby forming sidewalls 28.

Then, in the n-type region, n-type impurities are ion-implanted into the surface of the semiconductor substrate 1 on both sides of the gate electrode 73 and the sidewalls 28 to form the deep sources/drains 9 which partly overlap the extension regions 26. Meanwhile, in the p-type region, p-type impurities are ion-implanted into the surface of the semiconductor substrate 1 on both sides of the gate electrode 73 and the sidewalls 28 to form the deep sources/drains 10 which partly overlap the extension regions 27.

Thereafter, a several-layered interlayer dielectric covering the entire surface, contact holes, via holes, various kinds of wiring layers, and so on are formed, and a protective insulation film (none of them are shown) is formed on a top layer so that, on the semiconductor substrate 1, many semiconductor memory devices provided with a peripheral circuit including the SONOS type memory cells and the CMOS transistors are formed. Then, an individual semiconductor memory device is manufactured by separating and packaging the above-mentioned devices.

As explained above, according to the present embodiment, the ONO film 71 functioning as a charge-storage film is formed of high quality while maintaining a high charge-storage function, and furthermore, the gate insulation films 24 and 25 in the peripheral circuit are successfully formed with the ONO film 71. This makes it possible to realize a SONOS type semiconductor memory device of high reliability and low cost.

It should be noted that the present invention is not limited to the aforementioned embodiments. For example, in the embodiments described above, the ONO film is explained as the multilayered insulating film; however, the embodiments are also suitable for an ON film composed of the silicon nitride film on the silicon oxide film. In this case, for example, it is thought that, after the silicon oxide film is formed by the aforementioned plasma oxidizing method, a silicon film is deposited, and the silicon film is completely nitrided to form the silicon nitride film by the aforementioned plasma nitriding method. It is also thought the surface layer of the silicon oxide film is completely nitrided to form the silicon nitride film by the aforementioned plasma nitriding method after the silicon oxide film is formed by a CVD method, or the like.

According to the present invention, a multilayered insulating film such as an ON film, an ONO film, or the like is formed of high quality and in low temperature without generating hydrogen, capable of realizing a semiconductor memory device of high reliability.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method for manufacturing a semiconductor device, comprising:

a step of forming a lower silicon oxide film;

a step of forming a silicon film on the lower silicon oxide film;

a step of forming a silicon nitride film on the lower silicon oxide film to completely nitride the silicon film with a surface wave plasma generated by a plasma nitriding method, wherein a multilayered insulating film including at least the lower silicon oxide film and the silicon nitride film is formed; and a step of forming an upper silicon oxide film to oxidize a surface of the silicon nitride film by a plasma oxidizing method, wherein the multilayered insulating film composed of the lower silicon oxide film, the silicon nitride film, and the upper silicon oxide film is formed.

2. The method for manufacturing the semiconductor device according to claim 1, wherein the multilayered insulating film is formed as a dielectric film provided between a floating gate and a control gate in a memory cell.

3. The method for manufacturing the semiconductor device according to claim 1, wherein a gate insulation film composed of a silicon oxide film only is formed in a peripheral circuit region by the plasma oxidizing method simultaneously with the upper silicon oxide film.

4. The method for manufacturing the semiconductor device according to claim 1, wherein a film thickness of the silicon film is 5 nm or above.

5. The method for manufacturing the semiconductor device according to claim 1, wherein the upper silicon oxide film is formed by conducting oxidizing processing in which plasma is excited by microwave in an atmosphere of a source gas containing oxygen to generate an oxygen radical.

6. The method for manufacturing the semiconductor device according to claim 5, wherein the source gas does not contain hydrogen.

7. A method for manufacturing a semiconductor device, comprising:

a step of forming a lower silicon oxide film;

a step of forming a silicon film on the lower silicon oxide film; and a step of forming a silicon nitride film on the lower silicon oxide film to completely nitride the silicon film by a plasma nitriding method, wherein a multilayered insulating film including at least the lower silicon oxide film and the silicon nitride film is formed, wherein a film thickness of the silicon film is 5 nm or above.

8. The method for manufacturing the semiconductor device according to claim 7, wherein the silicon film is formed under a temperature condition of 700° C. or below.

9. The method for manufacturing the semiconductor device according to claim 7, wherein the silicon nitride film is a charge-storage film of a memory cell.

10. The method for manufacturing the semiconductor device according to claim 7, wherein the silicon nitride film is formed by conducting nitriding processing in which plasma is excited by microwave in an atmosphere of a source gas containing nitrogen to generate a nitrogen radical.

11. The method for manufacturing the semiconductor device according to claim 10, wherein the source gas does not contain hydrogen.

12. A method for manufacturing a semiconductor device, comprising:

a step of forming a lower silicon oxide film;

a step of forming a silicon film on the lower silicon oxide film;

a step of forming a silicon nitride film on the lower silicon oxide film to completely nitride the silicon film by a plasma nitriding method, wherein a multilayered insulating film including at least the lower silicon oxide film and the silicon nitride film is formed; and a step of forming an upper silicon oxide film to oxidize a surface of the silicon nitride film by a plasma oxidizing method, wherein the multilayered insulating film composed of the lower silicon oxide film, the silicon nitride film, and the upper silicon oxide film is formed, and wherein a gate insulation film composed of a silicon oxide film only is formed in a peripheral circuit region by the plasma oxidizing method simultaneously with the upper silicon oxide film.

* * * * *